United States Patent
Xu et al.

(10) Patent No.: US 11,270,622 B2
(45) Date of Patent: Mar. 8, 2022

(54) SHIFT REGISTER UNIT, DRIVING DEVICE, DISPLAY DEVICE AND DRIVING METHOD

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhuo Xu, Beijing (CN); Yajie Bai, Beijing (CN); Hailong Wu, Beijing (CN); Yan Zhou, Beijing (CN); Peng Liang, Beijing (CN); Min Ran, Beijing (CN); Haipeng Zhu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 585 days.

(21) Appl. No.: 16/305,270

(22) PCT Filed: Apr. 27, 2018

(86) PCT No.: PCT/CN2018/084845
§ 371 (c)(1),
(2) Date: Nov. 28, 2018

(87) PCT Pub. No.: WO2019/041853
PCT Pub. Date: Mar. 7, 2019

(65) Prior Publication Data
US 2021/0225251 A1    Jul. 22, 2021

(30) Foreign Application Priority Data

Aug. 31, 2017   (CN) .......................... 201710770891.2

(51) Int. Cl.
*G09G 3/20*            (2006.01)

(52) U.S. Cl.
CPC ... *G09G 3/2092* (2013.01); *G09G 2300/0426* (2013.01); *G09G 2310/0286* (2013.01);
(Continued)

(58) Field of Classification Search
CPC ............... G09G 3/2092; G09G 3/3266; G09G 3/3674–3681; G09G 3/3696;
(Continued)

(56) References Cited

U.S. PATENT DOCUMENTS

2006/0164376 A1    7/2006   Moon
2009/0237123 A1    9/2009   Jinta
(Continued)

FOREIGN PATENT DOCUMENTS

CN      102651239 A     8/2012
CN      106601190 A     4/2017
JP      2014-170612 A   9/2014

OTHER PUBLICATIONS

International Search Report and Written Opinion dated Jun. 20, 2018; PCT/CN2018/084845.
(Continued)

*Primary Examiner* — Nathan Danielsen

(57) ABSTRACT

A shift register unit, a driving device, a display device and a driving method are disclosed, The shift register unit includes a first circuit unit and a second circuit unit; the first circuit unit includes an input terminal, a reset terminal, a clock signal terminal, a first voltage terminal, a second voltage terminal and a first output terminal, and is configured to output a first output signal of the shift register unit from the first output terminal; the second circuit unit includes a third voltage terminal, a fourth voltage terminal and a second output terminal, and is configured to output a second output signal of the shift register unit from the second output terminal, at least under the control of the first (Continued)

output signal; and the second output signal and the first output signal are mutually phase-inverted signals.

24 Claims, 13 Drawing Sheets

(52) U.S. Cl.
CPC ... *G09G 2310/061* (2013.01); *G09G 2310/08* (2013.01); *G09G 2330/027* (2013.01)

(58) Field of Classification Search
CPC ...... G09G 2300/0421–043; G09G 2310/0243; G09G 2310/0262; G09G 2310/0286; G09G 2310/061; G09G 2310/08; G09G 2320/043; G09G 2320/045; G09G 2330/021; G09G 2330/027; G09G 2330/028
See application file for complete search history.

(56) References Cited

U.S. PATENT DOCUMENTS

| | | |
|---|---|---|
| 2011/0142191 A1 | 6/2011 | Tobita et al. |
| 2012/0293401 A1 | 11/2012 | Li et al. |
| 2014/0064436 A1 | 3/2014 | Ma |
| 2015/0325181 A1* | 11/2015 | Wang ..................... G11C 19/28 377/64 |
| 2016/0019833 A1* | 1/2016 | Wei ..................... G09G 3/3266 345/690 |
| 2018/0006099 A1* | 1/2018 | Ka ..................... H01L 27/1225 |
| 2019/0073948 A1* | 3/2019 | Wang ................... G09G 3/3266 |

OTHER PUBLICATIONS

Extended European Search Report Application No. 18800027.7; dated Jan. 4, 2021.

* cited by examiner

SHIFT REGISTER UNIT, DRIVING DEVICE, DISPLAY DEVICE AND DRIVING METHOD

The application claims priority to the Chinese patent application No. 201710770891.2, filed Aug. 31, 2017, the entire disclosure of which is incorporated herein by reference as part of the present application.

TECHNICAL FIELD

Embodiments of the present disclosure relate to a shift register unit, a driving device, a display device and a driving method.

BACKGROUND

In the field of display technology, the pixel array for such as liquid crystal display usually includes rows of gate lines and columns of data lines that intersect with the gate lines. Driving of the gate lines may be realized by an attached integrated drive circuit. In recent years, with the continuous improvement of amorphous silicon thin film process, the gate-line drive circuit may also be directly integrated onto a thin film transistor array substrate to form a GOA (Gate driver On Array) for driving gate lines.

For example, a GOA including a plurality of cascaded shift register units may be used to provide the rows of gate lines of a pixel array with ON/OFF voltage signals, thereby controlling sequential turning-on of the rows of gate lines, and to provide data signals to the pixel units of the corresponding rows in the pixel array via the data lines, so as to form grayscale voltages necessary for presenting each grayscale of an image. In turn, each frame image is displayed.

SUMMARY

At least an embodiment of the present disclosure provides a shift register unit, comprising a first circuit unit and a second circuit unit; the first circuit unit includes an input terminal, a reset terminal, a clock signal terminal, a first voltage terminal, a second voltage terminal and a first output terminal, and is configured to output a first output signal of the shift register unit from the first output terminal; the second circuit unit includes a third voltage terminal, a fourth voltage terminal and a second output terminal, and is configured to output a second output signal of the shift register unit from the second output terminal, at least under the control of the first output signal; and the second output signal and the first output signal are mutually phase-inverted signals.

In the shift register unit provided by at least an embodiment of the present disclosure, the second circuit unit includes a first switching circuit and a second switching circuit, the first switching circuit is connected between the third voltage terminal and the second output terminal, the second switching circuit is connected between the fourth voltage terminal and the second output terminal, and a control terminal of the second switching circuit is configured to be connected with the first output terminal so as to receive the first output signal.

In the shift register unit provided by at least an embodiment of the present disclosure, the first circuit unit includes: an input circuit, connected among the input terminal, the first voltage terminal and a pull-up node, and configured to charge the pull-up node in response to an input signal received by the input terminal; a pull-up node reset circuit, connected among the reset terminal, the pull-up node, the second voltage terminal and a pull-down node, and configured to reset the pull-up node, under control of a reset signal received by the reset terminal or level of the pull-down node; an output circuit, connected among the pull-up node, the clock signal terminal and the first output terminal, and configured to output a clock signal received by the clock signal terminal to the first output terminal, under control of level of the pull-up node; an output reset circuit, connected between the second voltage terminal and the first output terminal, and configured to reset the first output terminal, under control of the second output signal or level of the pull-down node; a pull-down circuit, connected among the first voltage terminal, the second voltage terminal, the pull-up node, the pull-down node and a first pull-down control node, and configured to control level of the pull-down node, under control of levels of the pull-up node and the first pull-down control node; and a first pull-down control circuit, connected between the first voltage terminal, the second voltage terminal, the pull-up node and the first pull-down control node, and configured to control level of the first pull-down control node, under control of level of the pull-up node.

In the shift register unit provided by at least an embodiment of the present disclosure, a control terminal of the first switching circuit is connected with the first pull-down control node, so that the first switching circuit is controlled by a level of the first pull-down control node.

In the shift register unit provided by at least an embodiment of the present disclosure, the input circuit includes: a first transistor, a gate electrode of which is configured to be connected with the input terminal so as to receive the input signal, a first electrode of which is configured to be connected with the first voltage terminal so as to receive a first voltage, and a second electrode of which is configured to be connected with the pull-up node so as to charge the pull-up node.

In the shift register unit provided by at least an embodiment of the present disclosure, the pull-up node reset circuit includes: a second transistor, a gate electrode of which is configured to be connected with a reset terminal so as to receive the reset signal, a first electrode of which is configured to be connected with the pull-up node so as to reset the pull-up node, and a second electrode of which is configured to be connected with the second voltage terminal so as to receive a second voltage; and a third transistor, a gate electrode of which is configured to be connected with the pull-down node, a first electrode of which is configured to be connected with the pull-up node so as to reset the pull-up node, and a second electrode of which is configured to be connected with the second voltage terminal so as to receive a second voltage.

In the shift register unit provided by at least an embodiment of the present disclosure, the output circuit includes: a fourth transistor, a gate electrode of which is configured to be connected with the pull-up node, a first electrode of which is configured to be connected with the clock signal terminal so as to receive the clock signal, and a second electrode of which is configured to be connected with the first output terminal so as to output the first output signal; and a storage capacitor, a first electrode of which is connected with the gate electrode of the fourth transistor, and a second electrode of which is connected the second electrode of the fourth transistor.

In the shift register unit provided by at least an embodiment of the present disclosure, the pull-down circuit includes: a fifth transistor, a gate electrode of which is configured to be connected with the first pull-down control node, a first electrode of which is configured to be connected with the first voltage terminal so as to receive a first voltage, and a second electrode of which is configured to be connected with the pull-down node; and a sixth transistor, a gate electrode of which is configured to be connected with the pull-up node, a first electrode of which is configured to be connected with the pull-down node, and a second electrode of which is configured to be connected with the second voltage terminal so as to receive a second voltage.

In the shift register unit provided by at least an embodiment of the present disclosure, the first pull-down control circuit includes: a seventh transistor, a gate electrode of which is connected with a first electrode of the seventh transistor, and is configured to be connected with the first voltage terminal so as to receive the first voltage, and a second electrode of which is configured to be connected with the first pull-down control node; and an eighth transistor, a gate electrode of which is configured to be connected with the pull-up node, a first electrode of which is configured to be connected with the first pull-down control node, and a second electrode of which is configured to be connected with the second voltage terminal so as to receive a second voltage.

In the shift register unit provided by at least an embodiment of the present disclosure, the output reset circuit includes: a ninth transistor, a gate electrode of which is configured to be connected with the pull-down node, a first electrode of which is configured to be connected with the first output terminal so as to output a second voltage to the first output terminal, and a second electrode of which is configured to be connected with the second voltage terminal so as to receive the second voltage.

In the shift register unit provided by at least an embodiment of the present disclosure, the output reset circuit includes: a ninth transistor, a gate electrode of which is configured to be connected with the second output terminal, a first electrode of which is configured to be connected with the first output terminal so as to output a second voltage to the first output terminal, and a second electrode of which is configured to be connected with the second voltage terminal so as to receive the second voltage.

In the shift register unit provided by at least an embodiment of the present disclosure, the first switching circuit includes: a tenth transistor, a gate electrode of which functioning as a control terminal of the first switching circuit is connected with the first pull-down control node, a first electrode of which is configured to be connected with the third voltage terminal so as to receive a third voltage, and a second electrode of which is configured to be connected with the second output terminal so as to output the third voltage.

In the shift register unit provided by at least an embodiment of the present disclosure, the second switching circuit includes: an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage.

In the shift register unit provided by at least an embodiment of the present disclosure, the first circuit unit further includes a second pull-down control circuit, and the second pull-down control circuit is configured to control a level of a second pull-down control node, under control of the first output signal, a control terminal of the first switching circuit is connected with the second pull-down control node, so that the first switching circuit is controlled by the level of the second pull-down control node.

In the shift register unit provided by at least an embodiment of the present disclosure, the second pull-down control circuit includes: a twelfth transistor, a gate electrode of which is configured to be connected with the first voltage terminal so as to receive a first voltage, a first electrode of which is configured to be connected with the third voltage terminal so as to receive a third voltage, and a second electrode of which is configured to be connected with the second pull-down control node; and a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

In the shift register unit provided by at least an embodiment of the present disclosure, the second pull-down control circuit includes: a twelfth transistor, a gate electrode of which is connected with a first electrode of the twelfth transistor, and is configured to be connected with the first voltage terminal so as to receive a first voltage, and a second electrode of which is configured to be connected with the second pull-down control node; and a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

In the shift register unit provided by at least an embodiment of the present disclosure, the second pull-down control circuit includes: a twelfth transistor, a gate electrode of which is connected with a first electrode of the twelfth transistor, and is configured to be connected with the third voltage terminal so as to receive a third voltage, and a second electrode of which is configured to be connected with the second pull-down control node; and a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

In the shift register unit provided by at least an embodiment of the present disclosure, the first switching circuit includes: a tenth transistor, a gate electrode of which is configured to be connected with the first output terminal, a first electrode of which is configured to be connected with the third voltage terminal, and a second electrode of which is configured to be connected with the second output terminal so as to output the third voltage; the second switching circuit includes: an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage; one of the tenth transistor and the eleventh transistor is an N-type transistor, and the other of the tenth transistor and the eleventh transistor is an N-type transistor is a P-type transistor.

In the shift register unit provided by at least an embodiment of the present disclosure, the second circuit unit further includes an inverter, and the inverter is connected between a control terminal of the first switching circuit and the first output terminal, and configured to make the first output signal be inverted in phase and then transmit the first output signal after inverting to the control terminal of the first switching circuit.

At least an embodiment of the present disclosure provides a driving device, comprising a plurality of cascaded shift register units of the above embodiments; except for a shift register unit at a first level, an input terminal of a shift register unit at every one of remaining levels is connected with a first output terminal of a shift register unit at a previous level; and except for a shift register unit at a last level, a reset terminal of a shift register unit at every one of remaining levels is connected with a first output terminal of a shift register unit at a next level.

At least an embodiment of the present disclosure provides a display device, comprising the driving device of the embodiment of the present disclosure.

The display device provided by at least one embodiment of the present disclosure further comprises a display panel, and the display panel includes a plurality of transistors for display that are distributed in an array, the transistors for display include double-gate type transistors, a first output terminal of a shift register unit of each row is electrically connected with a first gate electrode of a transistor for display in a current row, and a second output terminal of a shift register unit of each row is electrically connected with a second gate electrode of a transistor for display in the current row.

At least an embodiment of the present disclosure provides a driving method of the shift register unit, comprising: in a first stage, charging a pull-up node with a first voltage input from the first voltage terminal, outputting a low level input from the clock signal terminal by the first output terminal, and outputting a high level input from the third voltage terminal by the second output terminal; in a second stage, raising a potential of the pull-up node by a high level input from the clock signal terminal, outputting the high level input from the clock signal terminal by the first output terminal, and outputting a low level input from the fourth voltage terminal by the second output terminal; in a third stage, resetting the pull-up node by the reset terminal in response to a reset signal, outputting a low level input from the second voltage terminal by the first output terminal, and outputting a high level input from the third voltage terminal by the second output terminal; the second output signal output by the second output terminal and the first output signal output by the first output terminal are mutually phase-inverted signals.

At least an embodiment of the present disclosure provides a driving method of the display device, comprising, providing a first gate driving signal by the first output terminal of the shift register unit of each row to the first gate electrode of the transistor for display in the current row; providing a second gate driving signal by the second output terminal of the shift register unit of each row to the second gate electrode of the transistor for display in the current row; and adjusting ON/OFF voltage of the transistor for display in the current row, with aid of a third voltage terminal and a fourth voltage terminal of the shift register unit of each row.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the display panel technology, in order to achieve low cost and narrow frame design, GOA (Gate driver On Array) technology may be adopted, namely, a gate drive circuit is integrated on a panel through the thin film transistor processes. Thus, the advantages of narrow frame, reduction in assembly cost and so on can be realized. A general GOA circuit is formed by cascade of shift register units, and for example, it is designed with bottom-gate-controlled TFTs (thin-film transistors). The waveform output by a shift register unit is generally a rectangular high-level shift pulse, a high level of which is used to turn on a TFT in a display area, and a low level of which is used to turn off the TFT in the display area.

Figure 1A:
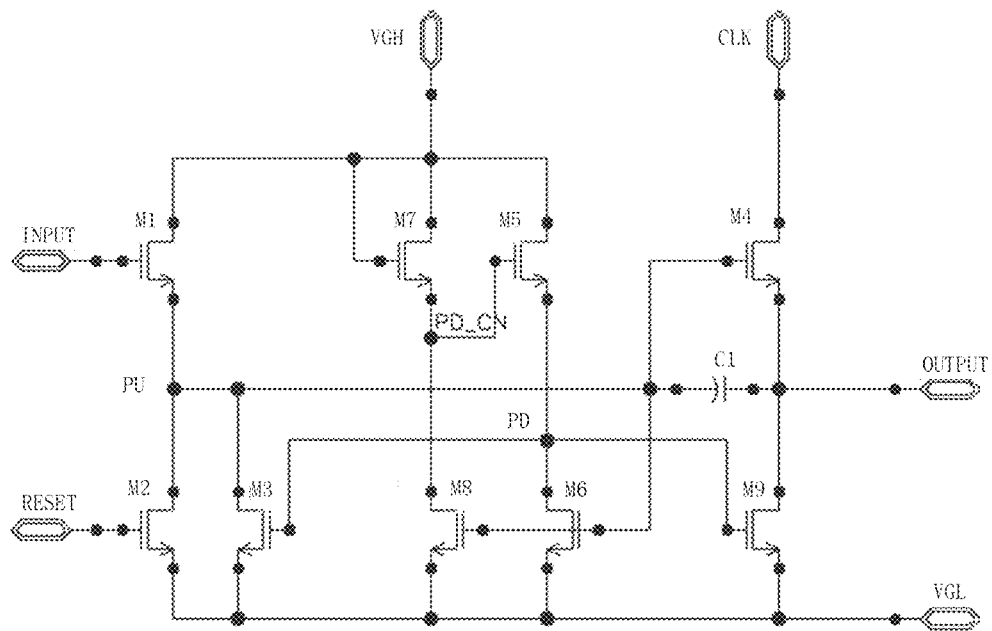
FIG. 1A is a schematic circuit diagram illustrating a shift register unit.

FIG. 1A illustrates the circuit structure of a shift register unit. As shown in FIG. 1A, the shift register unit includes an input circuit, a pull-up node reset circuit, an output circuit, a pull-down circuit, a pull-down control circuit, and an output reset circuit.

The input circuit includes a first transistor M1, a gate electrode of which is connected with an input terminal INPUT of the shift register unit, a first electrode of which is connected with a first voltage terminal VGH (e.g., for input of a high level), and a second electrode of which is connected with a pull-up node PU.

The pull-up node reset circuit includes: a second transistor M2, a gate electrode of which is connected with a reset terminal RESET of the shift register unit, a first electrode of which is connected with the pull-up node PU, and a second electrode of which is connected with a second voltage terminal VGL (e.g., for input of a low level); and a third transistor M3, a gate electrode of which is connected with a pull-down node PD, a first electrode of which is connected with the pull-up node PU, and a second electrode of which is connected with the second voltage terminal VGL.

The output circuit includes: a fourth transistor M4, a gate electrode of which is connected with the pull-up node PU, a first electrode of which is connected with a clock signal terminal CLK, and a second electrode of which is connected with a first output terminal OUTPUT of the shift register unit; and a storage capacitor C1, which is connected between the gate electrode and the second electrode of the fourth transistor M4.

The pull-down circuit includes: a fifth transistor M5, a gate electrode of which is connected with a first pull-down control node PD_CN, a first electrode of which is connected with the first voltage terminal VGH, and a second electrode of which is connected with the pull-down node PD; and a sixth transistor M6, a gate electrode of which is connected with the pull-up node PU, a first electrode of which is connected with the pull-down node PD, and a second electrode of which is connected with the second voltage terminal VGL.

The pull-down control circuit includes: a seventh transistor M7, a gate electrode of which is connected with a first electrode of the seventh transistor and the first voltage terminal VGH, and a second electrode of which is connected with the first pull-down control node PD_CN; and an eighth transistor M8, a gate electrode of which is connected with the pull-up node PU, a first electrode of which is connected with the first pull-down control node PD_CN, and a second electrode of which is connected with the second voltage terminal VGL.

The output reset circuit includes a ninth transistor M9, a gate electrode of which is connected with the pull-down node PD, a first electrode of which is connected with the first output terminal OUTPUT, and a second electrode of which is connected with the second voltage terminal VGL.

For example, the above transistors are all N-type transistors, descriptions will be given below with N-type transistors as examples as well, but embodiments of this disclosure are not limited to this case.

Figure 1B:
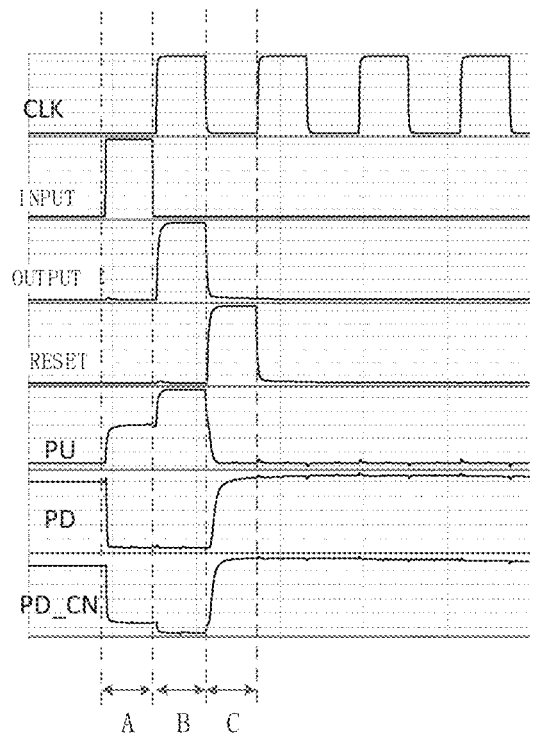
FIG. 1B is a signal timing diagram corresponding to FIG. 1A.

The working principle of the shift register unit shown in FIG. 1A will be illustrated below in combination with the signal timing shown in FIG. 1B, and in three stages including a first stage A, a second stage B and a third stage C shown in FIG. 1B, the shift register unit conducts the following operations.

In the first stage A, a low level is input from the clock signal terminal CLK, a high level is input from the first voltage terminal VGH (for example, the first voltage terminal can be configured to keep inputting a high-level signal), and a high level is input from the input terminal INPUT. Because the input terminal INTPUT inputs a high level, the first transistor M1 is turned on, and this leads to the fact that the pull-up node PU is charged by the high level input from the first voltage terminal VGH, and the potential of the pull-up node PU is charged to a first high level.

Because the first voltage terminal VGH keeps inputting a high level, the seventh transistor M7 is switched on, and the first pull-down control node PD_CN is charged. Thus, the fifth transistor M5 is turned on, and in turn, a high level input from the first voltage terminal VGH acts to charge the pull-down node PD as well. Since the pull-up node PU is at the first high level, the sixth transistor M6 and the eighth transistor M8 are turned on, thus enabling both the pull-down node PD and the first pull-down control node PD_CN to be electrically connected with the second voltage terminal VGL (for example, the second voltage terminal can be configured to keep inputting a low-level signal). In the design of transistors, the seventh transistor M7 and the eighth transistor M8 may be configured (for example, in terms of size ratio of the two, threshold voltage, etc.) in such a way that the level of the first pull-down control node PD_CN is pulled down to a low level when both the transistors M7 and M8 are switched on; similarly, the fifth transistor M5 and the sixth transistor M6 may be configured (for example, in terms of size ratio of the two, threshold voltage, etc.) in such a way that the level of the pull-down node PD is pulled down to a low level when both the transistors M5 and M6 are switched on. Consequently, this ensures that the third transistor M3 and the ninth transistor M9 are in a cut-off state at this stage.

Because the pull-up node PU is at the first high level, the fourth transistor M4 is turned on. At this time, the clock signal terminal CLK inputs a low level, and so at this stage, the first output terminal OUTPUT outputs the low-level signal.

In the second stage B, a high level is input from the clock signal terminal CLK, a high level is still input from the first voltage terminal VGH, and a low level is input from the input terminal INPUT. Because the input terminal INPUT inputs a low level, the first transistor M1 is cut off, and the pull-up node PU is maintained at the first high level of the previous stage. Thus, this causes the fourth transistor M4 to be kept to be turned on. Because a high level is input from the clock signal terminal at this stage, a high-level signal is output from the first output terminal OUTPUT.

Due to the bootstrap effect of the memory capacitor C1, the level of the pull-up node PU is further raised, up to a second high level, and this makes the conduction state of the fourth transistor M4 be more sufficient. Because the potential of the pull-up node PU is at a high level, the sixth transistor M6 and the eighth transistor M8 continue to be turned on, and the potentials of the pull-down node PD and the first pull-down control node PD_CN are pulled down respectively to a low level that is input from the second voltage terminal. Because the potential of the pull-down node PD is at a low level, the third transistor M3 and the ninth transistor M9 remain in a cut-off state. Thereby, the normal output of the shifting signal from the shift register unit will not be affected.

In the third stage C, a low level is input from the clock signal terminal CLK, a high level continues to be input from the first voltage terminal VGH, a low level continues to be input from the input terminal INPUT, and a high level is input from the reset terminal RESET. Because a high level is input from the reset terminal RESET, the second transistor M2 is switched on, and the potential of the pull-up node PU is pulled down to a low level input from the second voltage terminal VGL. Thereby, the fourth transistor M4 is cut off.

Because the first voltage terminal VGH keeps inputting a high level, the seventh transistor M7 is switched on, and the first pull-down control node PD_CN is charged. In turn, the fifth transistor MS is switched on, and thus the pull-down node PD is charged. Because the potential of the pull-up node PU is at a low level, the sixth transistor M6 and the eighth transistor M8 are cut off, the discharge path of the pull-down node PD is cut off, and the pull-down node PD is charged to a high level. As a result, the third transistor M3 and the ninth transistor M9 are switched on, and thus the potentials of the pull-up node PU and the first output terminal OUTPUT are pulled down respectively to a low level input from the second voltage terminal VGL. Consequently, the noise that may be generated by the shift register unit at its first output terminal OUTPUT and the pull-up node PU in the non-output phase is eliminated.

For example, a GOA drive circuit can be constructed by using a plurality of cascaded shift register units. When the GOA drive circuit is used to drive TFTs in a display area of a display panel, in order to enhance the on-state current of TFTs upon pixel charging, it may be generally chosen to increase a driving voltage. However, the amplitude of the voltage may be limited by an IC (integrated circuit) or a PCB board (Printed Circuit Board), (and for example, over high voltage may lead to heat generation of the IC, overload and other problems). In addition, because TFTs in the display area share high-level and low-level signals with TFTs in a GOA area (e.g., a high level input by the clock signal terminal CLK and a high level input by the first voltage terminal VGH are the same voltage signal), TFTs in the display area and TFTs in the GOA region are caused to work in the same bias state. When defects (such as residual images, crosstalk, etc. resulting from ON/OFF current drift and threshold voltage shift) occur in TFTs in the display area, improving the charging effect of the display area by means of adjusting the ON/OFF voltage of TFTs in the display area will cause TFTs in the GOA region to be impacted as well. As a result, TFT defects in the GOA region may happen.

According to at least one embodiment of the present disclosure, there is provided a shift register unit. The shift register unit comprises a first circuit unit and a second circuit unit; the first circuit unit includes an input terminal, a reset terminal, a clock signal terminal, a first voltage terminal, a second voltage terminal and a first output terminal, and is configured to output a first output signal of the shift register unit from the first output terminal; the second circuit unit includes a third voltage terminal, a fourth voltage terminal and a second output terminal, and is configured to output a second output signal of the shift register unit from the second output terminal, at least under the control of the first output signal; and the second output signal and the first output signal are mutually phase-inverted signals.

According to at least one embodiment of the present disclosure, there are further provided a driving device, a display device and a driving method corresponding to the aforesaid shift register unit.

With the shift register unit, the driving device, the display device, and the driving method provided by embodiments of the present disclosure, a double-channel phase-inverted signal output can be realized; when a TFT having a double-gate structure in a display area of a display panel is driven for example, it is possible that driving voltage is reduced and the driving ability is enhanced. Moreover, the poor reliability of TFTs in the display area can be effectively improved as well, without affecting TFTs in a GOA region.

It is to be noted that, in embodiments of the present disclosure, a first output signal and a second output signal of the shift register unit being mutually phase-inverted signals means that, when one of the first output signal and the second output signal is a high-level signal, the other is a low-level signal.

Hereinafter, embodiments of this disclosure and their examples will be described in detail in conjunction with the attached drawings.

Figure 2:
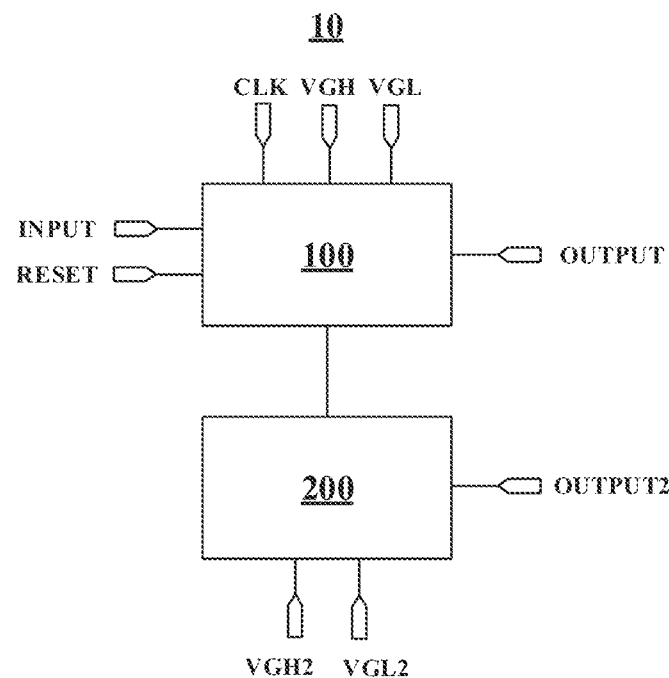
FIG. 2 is a schematic block diagram illustrating a shift register unit provided by at least one embodiment of the present disclosure.

According to at least one embodiment of the present disclosure, there is provided a shift register unit 10, which includes a first circuit unit 100 and a second circuit unit 200, as shown in FIG. 2.

For example, the first circuit unit 100 includes an input terminal INPUT, a reset terminal RESET, a clock signal terminal CLK, a first voltage terminal VGH, a second voltage terminal VGL and a first output terminal OUTPUT, and is configured to output a first output signal of the shift register unit 10 from the first output terminal OUTPUT.

For example, the second circuit unit 200 includes a third voltage terminal VGH2, a fourth voltage terminal VGL2 and a second output terminal OUTPUT2, and is configured to output a second output signal of the shift register unit 10 from the second output terminal OUTPUT2, at least under the control of the first output signal. The second output signal and the first output signal are mutually phase-inverted signals.

For example, the shift register unit 10 shown in FIG. 2 may be used to drive a TFT having a double-gate structure in the display area of the display panel for example and functioning as a data write switching circuit in a pixel unit. For example, the first output terminal OUTPUT may be electrically connected to a first gate electrode (e.g., bottom gate electrode) of a double-gate TFT, so that the first gate electrode is driven by the first output signal; and for example, a second output terminal OUTPUT2 may be electrically connected to a second gate electrode (e.g., top gate electrode) of the double-gate TFT, so that the second gate electrode is driven by the second output signal.

By applying two output signals that are mutually phase-inverted to two gate electrodes of the double-gate TFT, respectively, the driving voltage can be reduced, and thus the logic power consumption is reduced on condition that the same charging rate is satisfied. Moreover, by means of adjusting the voltage signals input by the third voltage terminal VGH2 and the fourth voltage terminal VGL2, the driving voltage of the second gate electrode (e.g., top gate electrode) of the double-gate TFT can also be adjusted. Thus, the ON/OFF current drift and threshold voltage shift of TFTs in the display area can be compensated, without affecting the TFTs in the shift register unit 10.

Figure 3:
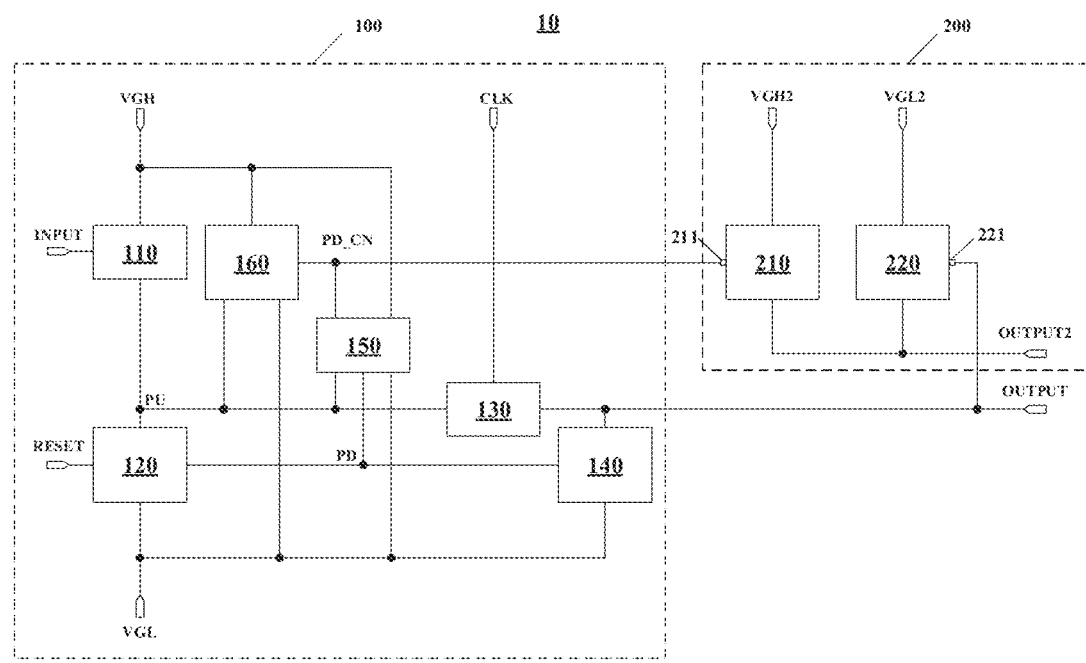
FIG. 3 is a schematic block diagram illustrating a shift register unit provided by an embodiment of the present disclosure.

For example, as shown in FIG. 3, in one embodiment of the present disclosure, the first circuit unit 100 may include the following circuit structure: an input circuit 110, a pull-up node reset circuit 120, an output circuit 130, an output reset circuit 140, a pull-down circuit 150 and a pull-down control circuit 160.

The input circuit 110 is connected among an input terminal INPUT, a first voltage terminal VGH and a pull-up node PU, and is configured to charge the pull-up node PU in response to an input signal received by the input terminal INPUT.

The pull-up node reset circuit 120 is connected among the reset terminal RESET, the pull-up node PU, the second voltage terminal VGL and the pull-down node PD, and is configured to reset the pull-up node PU under the control of a reset signal received by the reset terminal RESET or the level at the pull-down node PD.

The output circuit 130 is connected among the pull-up node PU, the clock signal terminal CLK and the first output terminal OUTPUT, and is configured to output a clock signal received by the clock signal terminal CLK to the first output terminal OUTPUT, under the control of the level at the pull-up node PU.

The output reset circuit 140 is connected between the second voltage terminal VGL and the first output terminal OUTPUT, and is configured to reset the first output terminal OUTPUT under the control of the level at the pull-down node PD.

The pull-down circuit 150 is connected among the first voltage terminal VGH, the second voltage terminal VGL, the pull-up node PU, the pull-down node PD and the first pull-down control node PD_CN, and is configured to control the level at the pull-down node PD, under the control of levels at the pull-up node PU and the first pull-down control node PD_CN.

The first pull-down control circuit 160 is connected among the first voltage terminal VGH, the second voltage terminal VGL, the pull-up node PU and the first pull-down control node PD_CN, and is configured to control the level at the first pull-down control node PD_CN, under the control of the level at the pull-up node PU.

For example, as shown in FIG. 3, in one embodiment of the present disclosure, the second circuit unit 200 includes a first switching circuit 210 and a second switching circuit 220. The first switching circuit 210 is connected between the third voltage terminal VGH2 and the second output terminal OUTPUT2, and a control terminal 211 of the first switching circuit 210 is configured to be connected with the first pull-down control node PD_CN, so that the first switching circuit 210 is controlled by the level at the first pull-down control node PD_CN. The second switching circuit 220 is connected between the fourth voltage terminal VGL2 and the second output terminal OUTPUT2, and a control terminal 221 of the second switching circuit 220 is configured to be connected with the first output terminal OUTPUT so as to receive a first output signal.

Figure 4A:
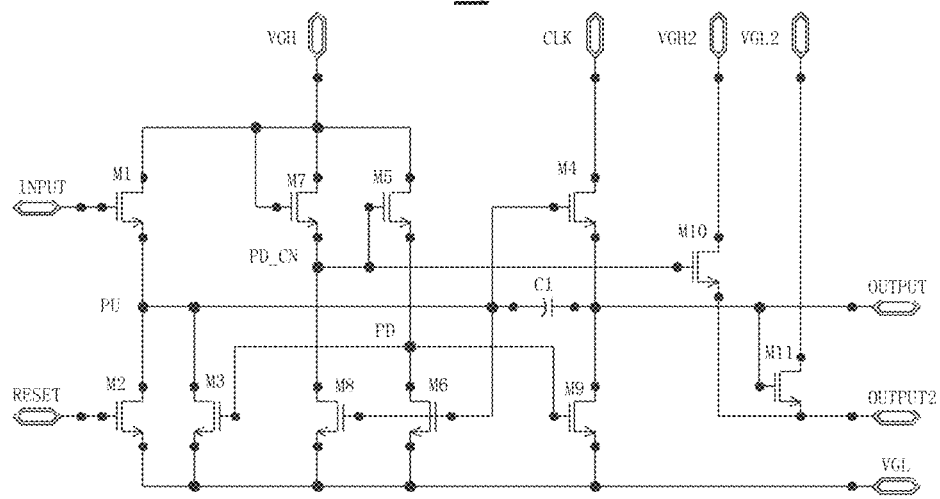
FIG. 4A is a schematic circuit diagram illustrating a concrete implementation example of the shift register unit shown in FIG. 3.

For example, the shift register unit 10 shown in FIG. 3 may be implemented in one example as the circuit structure shown in FIG. 4A. As shown in FIG. 4A, the shift register unit 10 includes first to eleventh transistors M1-M11 and a storage capacitor C1.

For example, as shown in FIG. 4A, in more detail, the input circuit 110 may be implemented as a first transistor M1 in this example. A gate electrode of the first transistor M1 is configured to be connected with the input terminal INPUT so as to receive an input signal, a first electrode of the first transistor is configured to be connected with the first voltage terminal VGH so as to receive a first voltage (e.g., the first voltage is a high-level signal), and a second electrode of the first transistor is configured to be connected with the pull-up node PU so as to charge the pull-up node PU.

The pull-up node reset circuit 120 may be implemented to include a second transistor M2 and a third transistor M3. A gate electrode of the second transistor M2 is configured to be connected with the reset terminal RESET so as to receive a reset signal, a first electrode of the second transistor is configured to be connected with the pull-up node PU so as to reset the pull-up node PU, and a second electrode of the second transistor is configured to be connected with the second voltage terminal VGL so as to receive a second voltage (e.g., the second voltage is a low-level signal). A gate electrode of the third transistor M3 is configured to be connected with the pull-down node PD, a first electrode of the third transistor is configured to be connected with the pull-up node PU so as to reset the pull-up node PU, and a second electrode of the third transistor is configured to be connected with the second voltage terminal VGL so as to receive a second voltage.

The output circuit 130 may be implemented to include a fourth transistor M4 and a storage capacitor C1. A gate electrode of the fourth transistor M4 is configured to be connected with the pull-up node PU, a first electrode of the fourth transistor is configured to be connected with the clock signal terminal CLK so as to receive a clock signal (for example, the clock signal is a periodically varying square wave), and a second electrode of the fourth transistor is configured to be connected with the first output terminal OUTPUT so as to output a first output signal. A first electrode of the storage capacitor C1 is connected to the gate electrode of the fourth transistor M4, and a second electrode of the storage capacitor is connected to the second electrode of the fourth transistor M4.

The pull-down circuit 150 may be implemented to include a fifth transistor M5 and a sixth transistor M6. A gate electrode of the fifth transistor M5 is configured to be connected with the first pull-down control node PD_CN, a first electrode of the fifth transistor is configured to be connected with the first voltage terminal VGH so as to receive a first voltage, and a second electrode of the fifth transistor is configured to be connected with the pull-down node PD. A gate electrode of the sixth transistor M6 is configured to be connected with the pull-up node PU, a first electrode of the sixth transistor is configured to be connected with the pull-down node PD, and a second electrode of the sixth transistor is configured to be connected with the second voltage terminal VGL so as to receive a second voltage.

The first pull-down control circuit 160 may be implemented to include a seventh transistor M7 and an eighth transistor M8. A gate electrode of the seventh transistor M7 is connected to a first electrode of the seventh transistor, and configured to be connected with the first voltage terminal VGH so as to receive the first voltage, and a second electrode of the seventh transistor is configured to be connected with the first pull-down control node PD_CN. A gate electrode of the eighth transistor M8 is configured to be connected with the pull-up node PU, a first electrode of the eighth transistor is configured to be connected with the first pull-down control node PD_CN, and a second electrode of the eighth transistor is configured to be connected with the second voltage terminal VGL so as to receive the second voltage.

The output reset circuit 140 may be implemented as a ninth transistor M9. A gate electrode of the ninth transistor M9 is configured to be connected with the pull-down node PD, a first electrode of the ninth transistor is configured to be connected with the first output terminal OUTPUT so as to output the second voltage to the first output terminal OUTPUT, and a second electrode of the ninth transistor is configured to be connected with the second voltage terminal VGL so as to receive the second voltage.

The first switching circuit 210 may be implemented as a tenth transistor M10. A gate electrode of the tenth transistor M10 functioning as a control terminal of the first switching circuit 210 is configured to be connected with the first pull-down control node PD_CN, a first electrode of the tenth transistor is configured to be connected with the third voltage terminal VGH2 so as to receive a third voltage, and a second electrode of the tenth transistor is configured to be connected with the second output terminal OUTPUT2 so as to output the third voltage.

The second switching circuit 220 may be implemented as an eleventh transistor M11. A gate electrode of the eleventh transistor M11 functioning as a control terminal of the second switching circuit 220 is configured to be connected with the first output terminal OUTPUT, a first electrode of the eleventh transistor is configured to be connected with the fourth voltage terminal VGL2 so as to receive a fourth voltage, and a second electrode of the eleventh transistor is configured to be connected with the second output terminal OUTPUT2 so as to output the fourth voltage.

It is to be noted that, transistors used in embodiments of the present disclosure may all be thin film transistors, field effect transistors or other switching devices with the same characteristics, and in each of embodiments of the present disclosure, descriptions are given with thin film transistors as an example. Source and drain electrodes of a transistor used here may be symmetrical in structure, and so the source and drain electrodes may have no difference in structure. In embodiments of the present disclosure, for the sake of distinguishing two electrodes of a transistor except the gate electrode, it is directly to describe one of the electrodes as a first electrode and the other one of the electrodes as a second electrode.

Besides, transistors in embodiments of the present disclosure are all illustrated by taking N-type transistors as examples, and in this case, the first electrode may be a drain electrode and the second electrode may be a source electrode. It is to be noted that, the disclosure includes this case, but is not limited thereto. For example, one or more transistors in a shift register unit provided by an embodiment of the present disclosure may also employ a P-type transistor. In this case, the first electrode may be a source electrode, and the second electrode may be a drain electrode, and the only thing to do is to make corresponding connection of the port polarity of a transistor of the selected type in accordance with the port polarity of a corresponding transistor in an embodiment of the present disclosure.

Figure 4B:
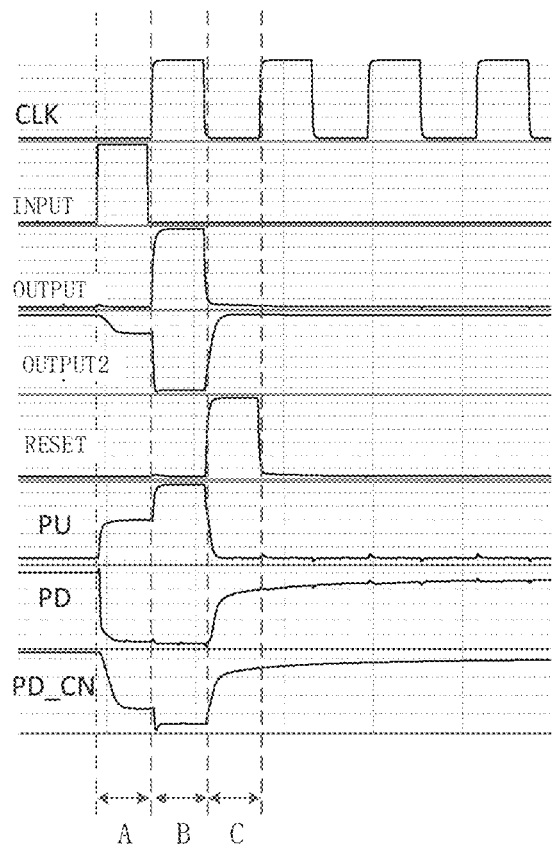
FIG. 4B is a signal timing diagram corresponding to FIG. 4A.

For example, as shown in FIG. 4A, all of transistors in the shift register unit 10 employ N-type transistors, first and third voltages of a high level are input from the first voltage terminal VGH and the third voltage terminal VGH2, respectively, and second and fourth voltages of a low level are input from the second voltage terminal VGL and the fourth voltage terminal VGL2, respectively. The working principle of the shift register unit shown in FIG. 4A will be illustrated below in combination with a signal timing diagram shown in FIG. 4B, and In the three stages of a first stage A, a second stage B and a third stage C shown in FIG. 4B, the shift register unit does the following operations.

Because a high level is always input from the first voltage terminal VGH, the seventh transistor M7 is switched on, and the first pull-down control node PD_CN is charged by the high level input from the first voltage terminal VGH. In turn, the fifth transistor M5 is turned on, and then, the high level input from the first voltage terminal VGH acts to charge the pull-down node PD as well. Therefore, prior to the first stage A, each of levels at the pull-down node PD and the first pull-down control node PD_CN is a high level. As a result of the high level of PD_CN, the tenth transistor M10 is turned on, and thus a high level is output from the second output terminal OUTPUT2 prior to the first stage A.

In the first stage A, a low level is input from the clock signal terminal CLK, a high level is input from the first voltage terminal VGH, and a high level is input from the input terminal INPUT. Because the input terminal INTPUT inputs a high level, the first transistor M1 is turned on, and this leads to the fact that the pull-up node PU is charged by the high level input from the first voltage terminal VGH, and the potential of the pull-up node PU is charged to a first high level.

Since the pull-up node PU is at the first high level, the sixth transistor M6 and the eighth transistor M8 are turned on, thus enabling both the pull-down node PD and the first pull-down control node PD_CN to be electrically connected with the second voltage terminal VGL. In the design of transistors, the fifth transistor M5 and the sixth transistor M6 may be configured (for example, in terms of size ratio of the two, threshold voltage, etc.) in such a way that the level of the pull-down node PD is pulled down to a low level when both the transistors M5 and M6 are switched on, and consequently, it is ensured that the third transistor M3 and the ninth transistor M9 are in a cut-off state at this stage. At this time, the first pull-down control node PD_CN is discharged in advance, and its potential is also pulled down, so that the tenth transistor M10 turns to be partially turned on. This leads to a slight decrease in a second output signal output from the second output terminal OUTPUT2 in the first stage A.

Because the pull-up node PU is at the first high level, the fourth transistor M4 is turned on. At this time, the clock signal terminal CLK inputs a low level, and so at the first stage A, the first output terminal OUTPUT outputs a low-level signal.

In the second stage B, a high level is input from the clock signal terminal CLK, the high level is still input from the first voltage terminal VGH, and a low level is input from the input terminal INPUT. Because the input terminal INPUT inputs the low level, the first transistor M1 is cut off, and the pull-up node PU is maintained at the first high level of the previous stage. Thus, the fourth transistor M4 is caused to be turned on. Because a high level is input from the clock signal terminal at this stage, a high-level signal is output from the first output terminal OUTPUT. Due to the bootstrap effect of a memory capacitor C1, the level of the pull-up node PU is further raised, up to a second high level, and this makes the conduction state of the fourth transistor M4 be more sufficient.

Because the pull-up node PU is pulled up to the second high level, the conduction state of the sixth transistor M6 and the eighth transistor M8 becomes more sufficient, and the potentials of the pull-down node PD and the first pull-down control node PD_CN are pulled down further. Because the potential of the pull-down node PD is a low level, the third transistor M3 and the ninth transistor M9 remain in a cut-off state. Thereby, the normal output of the first output terminal OUTPUT will not be affected.

Because the potential of the first pull-down control node PD_CN is further pulled down, the tenth transistor M10 is cut off, while the eleventh transistor M11 is turned on by the high level at the first output terminal OUTPUT. Thereby, a low-level signal input from the fourth voltage terminal VGL2 is output from the second output terminal OUTPUT2.

In the third stage C, a low level is input from the clock signal terminal CLK, the high level continues to be input from the first voltage terminal VGH, the low level continues to be input from the input terminal INPUT, and a high level is input from the reset terminal RESET. Because a high level is input from the reset terminal RESET, the second transistor M2 is switched on, the pull-up node PU is discharged via the second transistor M2, and the potential pf the pull-up node is pulled down to a low level. Thereby, the fourth transistor M4, the sixth transistor M6 and the eighth transistor M8 are cut off.

Because the sixth transistor M6 and the eighth transistor M8 are cut off, and discharge path of the pull-down node PD and the first pull-down control node PD_CN are cut off, the pull-down node PD and the first pull-down control node PD_CN are recharged to a high level. Due to the high level of the pull-down node PD, the third transistor M3 and the ninth transistor M9 are switched on, and thus the potentials of the pull-up node PU and the first output terminal OUTPUT are pulled down respectively to a low level. Consequently, the noise that may be generated by the shift register unit at its first output terminal OUTPUT and the pull-up node PU in the non-output phase is eliminated. In addition, because the low level of the first output OUTPUT makes the eleventh transistor be cut off, and the high level of the first pull-down control node PD_CN makes the tenth transistor M10 be turned on, in the third stage C, the second output terminal OUTPUT2 outputs a high-level signal that is input from the third voltage terminal VGH2.

In the shift register unit 10 shown in FIG. 4A, by setting the tenth transistor M10 and the eleventh transistor M11 and placing them under control of the level at the first pull-down control node PD_CN and the level at the first output terminal OUTPUT, respectively, a second output signal output by the second output terminal OUTPUT2 and a first output signal output by the first output terminal OUTPUT are mutually phase-inverted signals.

For example, the shift register unit 10 may be used to drive a TFT having a double-gate structure in the display area of the display panel for example and functioning as a data write switching circuit in a pixel unit. For example, the first output terminal OUTPUT may be electrically connected to a first gate electrode (e.g., bottom gate electrode) of a double-gate TFT, so that the first gate electrode is driven by the first output signal; and for example, a second output terminal OUTPUT2 may be electrically connected to a second gate electrode (e.g., top gate electrode) of the double-gate TFT, so that the second gate electrode is driven by the second output signal. For example, when the first output signal is of a high level and the second output signal is of a low level, a TFT in the display area is switched on; when the first output signal is of a low level and the second output signal is of a high level, the TFT in the display area is switched off.

By applying two output signals that are mutually phase-inverted to two gate electrodes of the double-gate TFT, respectively, the driving voltage can be reduced, and thus the logic power consumption is reduced on condition that the same charging rate is satisfied. Moreover, by means of adjusting the voltage signals input by the third voltage terminal VGH2 and the fourth voltage terminal VGL2, the driving voltage of the second gate electrode (e.g., top gate electrode) of the double-gate TFT can also be adjusted. Thus, the ON/OFF current drift and threshold voltage shift of TFTs in the display area can be compensated, without affecting TFTs in the shift register unit 10.

It is to be noted that, in the shift register unit provided in an embodiment of the present disclosure, the input circuit 110 may not be connected to the first voltage terminal VGH, either. In the event that the first circuit 110 is implemented as a first transistor M1, a first electrode of the first transistor M1 may be connected to its own gate electrode, and be further connected to the input terminal INPUT. In this case, when the pull-up node PU is charged in the first stage A, a high level input from the input terminal INPUT is directly used to charge the pull-up node PU. Each of the following embodiments is the same as the above mentioned case, and will not be restated.

In addition, in embodiments of the present disclosure, the first circuit unit 100 has been described on the basis of the 9T1C circuit structure as illustrated in FIG. 1A, but embodiments of the present disclosure include this, but are not limited thereto. For example, other circuit units that can output a shift driving signal may also act as the first circuit unit 100 in embodiments of the present disclosure, as long as a second circuit unit 200 is arranged accordingly in accordance with embodiments of the present disclosure.

Figure 5:
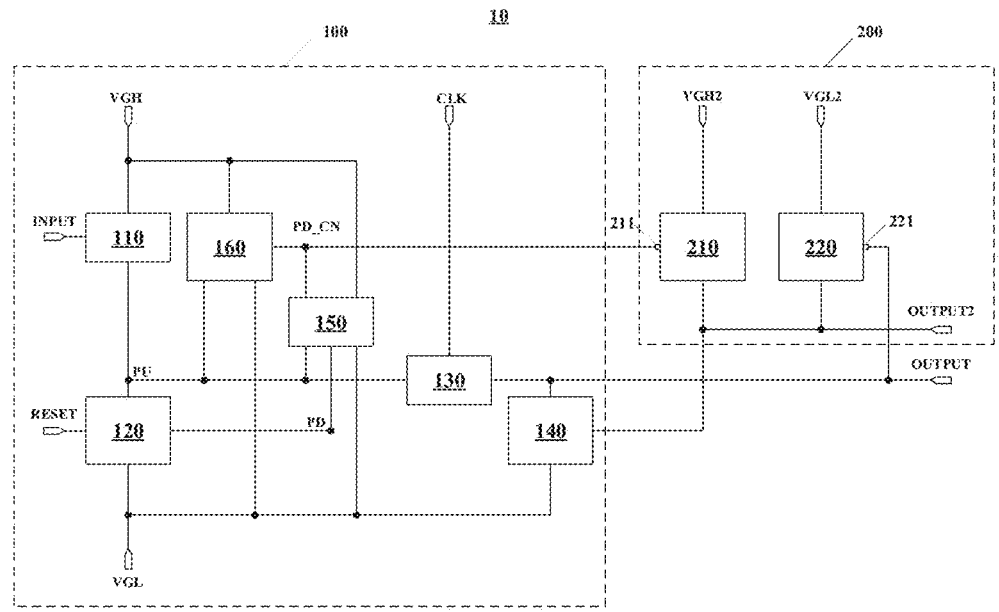
FIG. 5 is a schematic block diagram illustrating a shift register unit provided by another embodiment of the present disclosure.

According to another embodiment of the present disclosure, there is provided a shift register unit 10, as shown in FIG. 5, which differs from the shift register unit as shown in FIG. 3 in the connecting way of an output reset circuit 140. Here, the output reset circuit 140 is no longer connected to a pull-down node PD, but is connected to a second output terminal OUTPUT2, and thus a first output terminal OUTPUT is reset under the control of a second output signal.

Figure 6A:
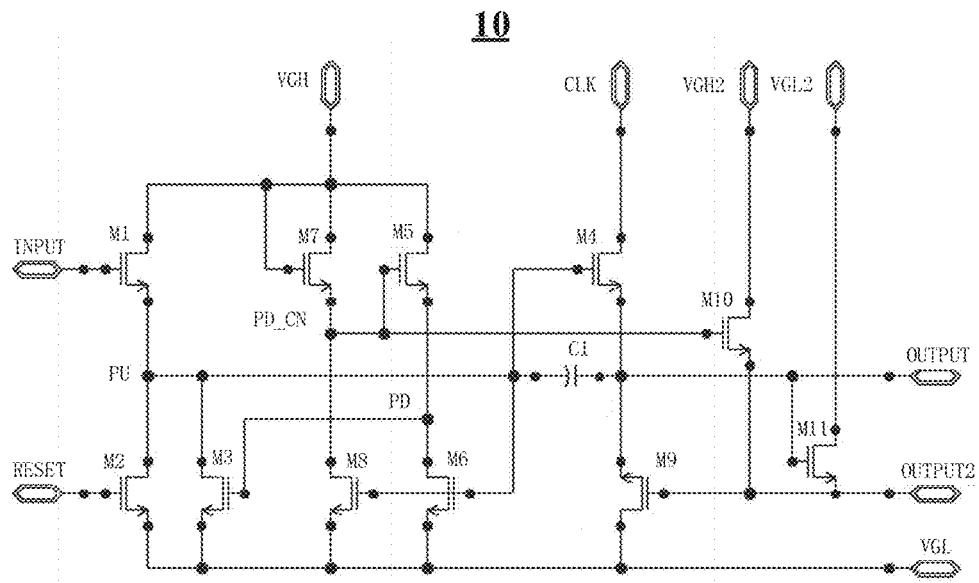
FIG. 6A is a schematic circuit diagram illustrating a concrete implementation example of the shift register unit shown in FIG. 5.

For example, similar to the embodiment shown in FIG. 3, the shift register unit 10 as shown in FIG. 5 may be implemented as a circuit structure as shown in FIG. 6A. The shift register unit 10 also includes first to eleventh transistors M1-M11 and a storage capacitor C1. The circuit structure of the shift register unit 10 shown in FIG. 6A differs from that in FIG. 4A in that, a gate electrode of the ninth transistor M9 is connected with the second output terminal OUTPUT2 in this embodiment.

Figure 6B:
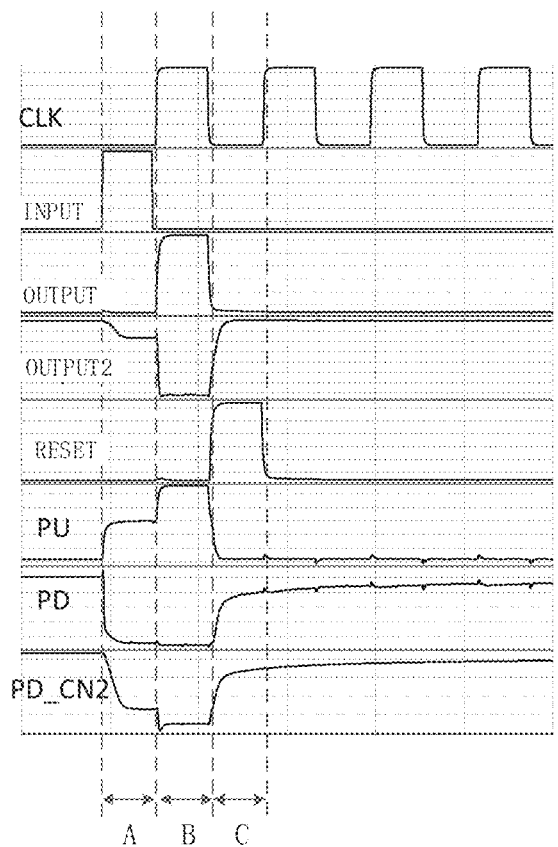
FIG. 6B is a signal timing diagram corresponding to FIG. 6A.

FIG. 6B is a signal timing diagram corresponding to FIG. 6A, and in the shift register unit 10 shown in FIG. 6A, the ninth transistor M9 becomes controlled by the second output terminal OUTPUT2. It can be attained from those as shown in FIG. 6B that, as compared to a pull-down node PD, the level of the second output terminal OUTPUT2 is at a high level for a longer time in a display frame. Thus, when the level of the second output terminal OUTPUT2 is used to control the ninth transistor M9, the effect of reset denoising on the first output terminal OUTPUT is better than the effect of controlling the ninth transistor M9 with use of the level of the pull-down node PD.

Regarding the working principle and technical effect of the shift register unit provided in the embodiment shown in FIG. 6A, reference to the corresponding descriptions in the embodiment shown in FIG. 4A can be made, and details are omitted here.

Figure 7:
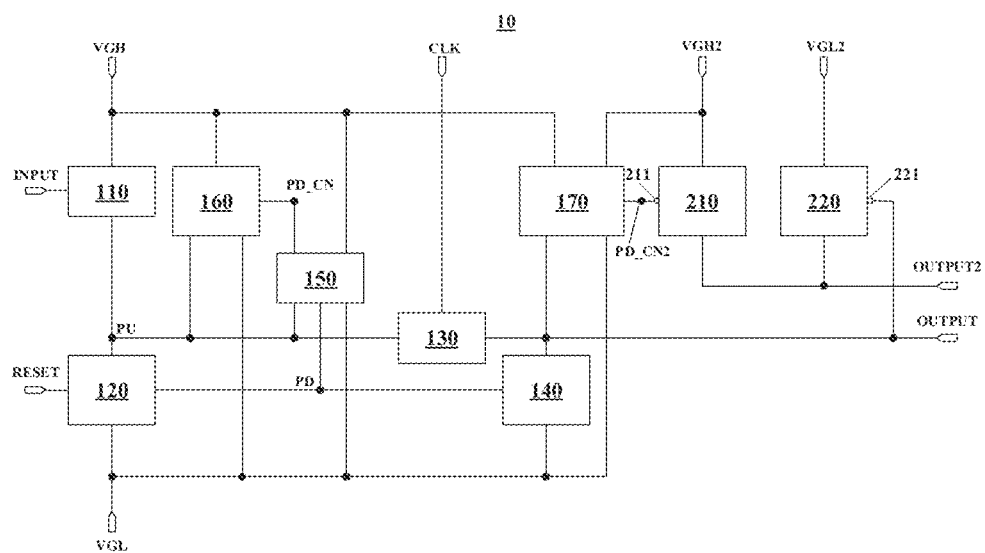
FIG. 7 is a schematic block diagram illustrating a shift register unit provided by another embodiment of the present disclosure.

According to another embodiment of this disclosure, there is provided a shift register unit 10. As shown in FIG. 7, the shift register unit 10 differs from the shift register unit shown in FIG. 3 in that, a first circuit unit can further include a second pull-down control circuit 170, which is configured to control the level of a second pull-down control node PD_CN2 under control of a first output signal. A control terminal 211 of a first switching circuit 210 is connected with the second pull-down control node PD_CN2, so that the first switching circuit 210 is controlled by the level of the second pull-down control node PD_CN2.

Figure 8A:
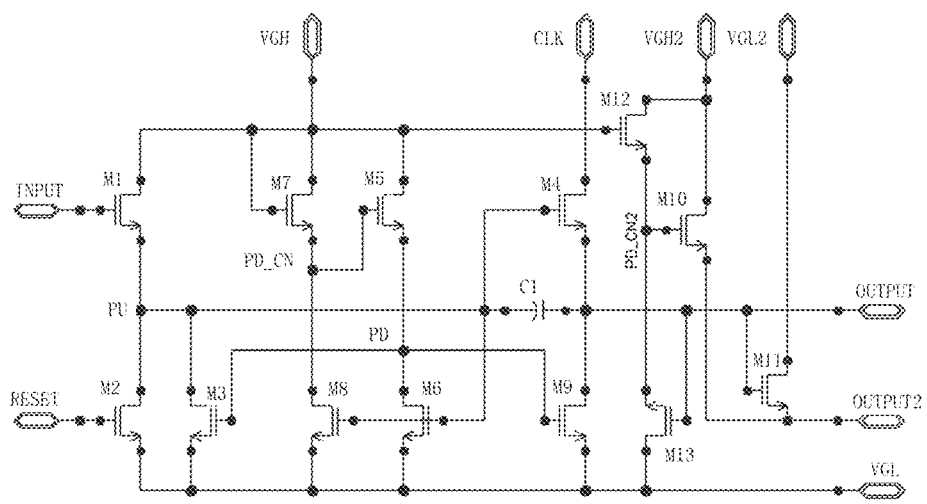
FIG. 8A is a schematic circuit diagram illustrating a concrete implementation example of the shift register unit shown in FIG. 7.

For example, similar to the above embodiments, the shift register unit 10 as shown in FIG. 7 may be implemented as a circuit structure as shown in FIG. 8A. The shift register unit 10 includes first to thirteenth transistors M1-M13 and a storage capacitor C1. The circuit structure of the shift register unit 10 shown in FIG. 8A differs from that in FIG. 4A in that, a gate electrode of the tenth transistor M10 is connected with the second pull-down control node PD_CN2 in this embodiment, and moreover, the twelfth transistor M12 and the thirteenth transistor M13 are added.

A gate electrode of the twelfth transistor M12 is configured to be connected with a first voltage terminal VGH so as to receive a first voltage, a first electrode of the twelfth transistor is configured to be connected with a third voltage terminal VGH2 so as to receive a third voltage, and a second electrode of the twelfth transistor is configured to be connected with the second pull-down control node PD_CN2. A gate electrode of the thirteenth transistor is configured to be connected with the first output terminal OUTPUT, a first electrode of the thirteenth transistor is configured to be connected with the second pull-down control node PD_CN2, and a second electrode of the thirteenth transistor is configured to be connected with a second voltage terminal VGL so as to receive a second voltage.

Figure 8B:
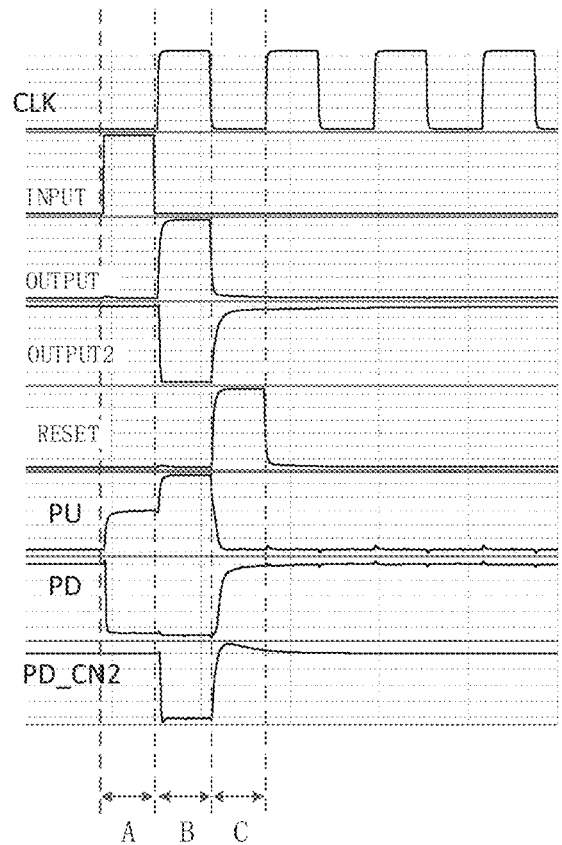
FIG. 8B is a signal timing diagram corresponding to FIG. 8A.

FIG. 8B is a signal timing diagram corresponding to FIG. 8A. In the shift register unit shown in FIG. 8A, the tenth transistor M10 is no longer controlled by the level of the first pull-down node PD_CN, but is controlled by using a separate level of the second pull-down control node PD_CN2. The difference between the shift register unit 10 shown in FIG. 8A and the shift register unit shown in FIG. 4A in operation will be illustrated below in conjunction with FIG. 8B.

Because a high level is input from the first voltage terminal VGH, the twelfth transistor M12 is maintained to be turned on, and the second pull-down control node PD_CN2 is charged by a high level input from the third voltage terminal VGH2 to a high level. So in the first stage A, the second pull-down control node PD_CN2 is maintained at a high level, and thus to control the tenth transistor M10 to be kept in the turned-on conduction. Therefore, it can be ensured that the level of the second output terminal OUTPUT2 is maintained at a high level prior to a second stage B, and will not appear a slight decrease.

Entering the second stage B, because a high level is output from the first output terminal OUTPUT, the thirteenth transistor M13 is switched on, and the level of the second pull-down control node PD_CN2 is pulled down to a low level. Thus, the tenth transistor M10 is cut off. At the same time, due to the high level output from the first output terminal OUTPUT, the eleventh transistor M11 is switched on. So in the second stage B, the second output terminal OUTPUT2 outputs a low-level signal.

It is to be noted that, regarding other parts of the shift register unit provided in the embodiment shown in FIG. 8A and the technical effects, reference to the corresponding descriptions in the embodiment shown in FIG. 4A can be made, and they are not restated herein.

Figure 9:
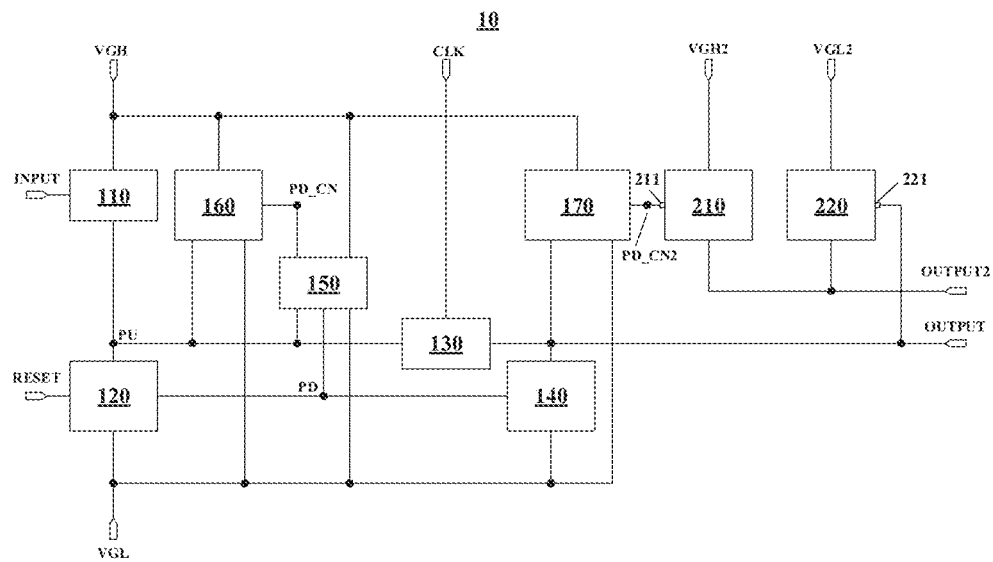
FIG. 9 is a schematic block diagram illustrating a shift register unit provided by another embodiment of the present disclosure.

According to another embodiment of this disclosure, there is provided a shift register unit 10. As shown in FIG. 9, the shift register unit 10 differs from the shift register unit shown in FIG. 7 in that, a second pull-down control circuit 170 is merely connected with a first voltage terminal VGH in this embodiment, but is not connected with a third voltage terminal VGH2.

Figure 10A:
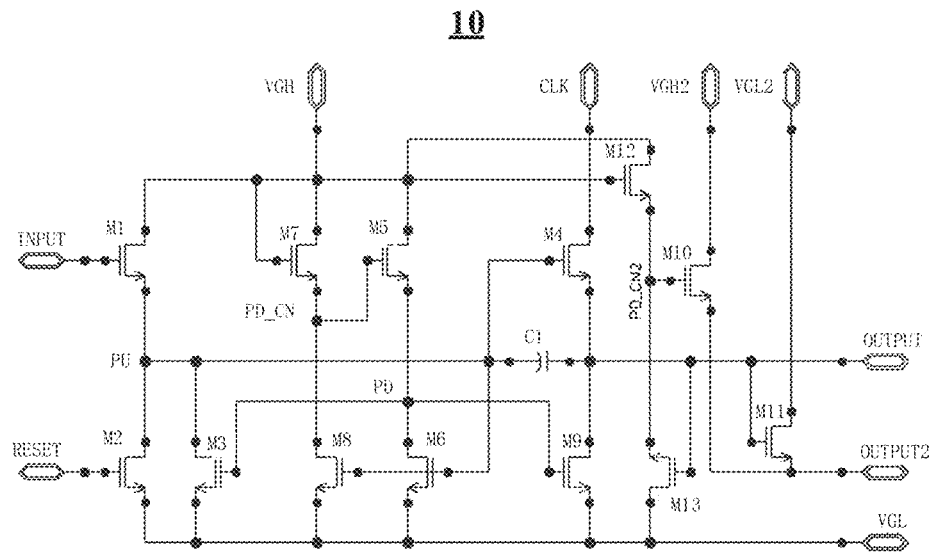
FIG. 10A is a schematic circuit diagram illustrating a concrete implementation example of the shift register unit shown in FIG. 9.

For example, similar to the embodiment shown in FIG. 7, the shift register unit 10 as shown in FIG. 9 may be implemented as a circuit structure as shown in FIG. 10A. Likewise the shift register unit 10 includes first to thirteenth transistors M1-M13 and a storage capacitor C1. The circuit structure of the shift register unit 10 shown in FIG. 10A differs from that in FIG. 8A in that, a gate electrode of the twelfth transistor M12 is connected with a first electrode of the twelfth in this embodiment, and is configured to be connected with the first voltage terminal VGH so as to receive a first voltage.

Figure 10B:
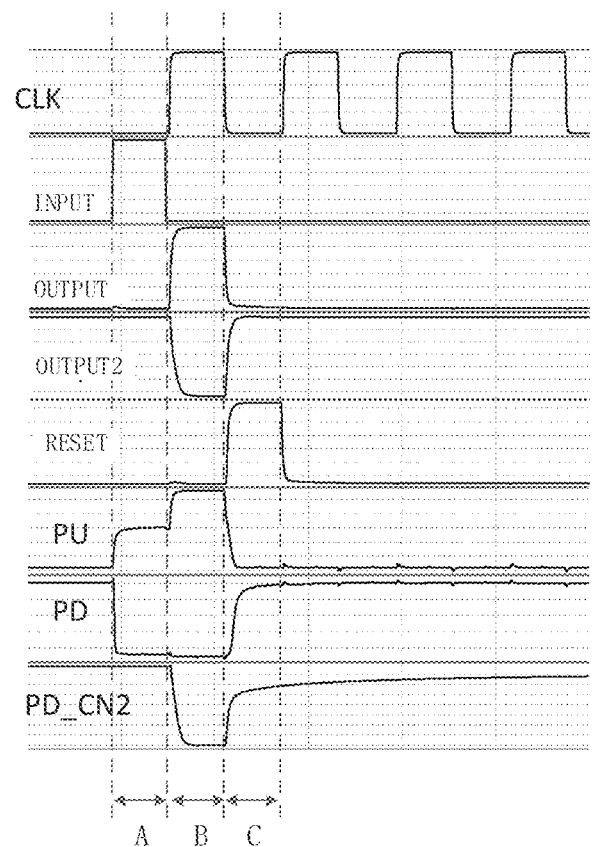
FIG. 10B is a signal timing diagram corresponding to FIG. 10A.

FIG. 10B is a signal timing diagram corresponding to FIG. 10A, and the difference between the shift register unit 10 shown in FIG. 10A and the shift register unit shown in FIG. 8A in operation will be illustrated below in conjunction with FIG. 10B.

For example, when a first voltage input by the first voltage terminal VGH is higher than a third voltage input by the third voltage terminal VGH2, a second pull-down control node PD_CN2 will be charged to a higher level, and its control ability will become stronger. Therefore, when the second pull-down control node PD_CN2 is pulled down at the second stage B, the time for the falling edge of its level will become longer. In turn, this causes the time for the falling edge of the second output terminal OUTPUT2 to become longer.

By the above way, the waveform of a second output signal output by the second output terminal OUTPUT2 can be adjusted to be symmetric (or approximately symmetric) with the waveform of a first output signal output by the first output terminal OUTPUT. Thus, when the shift register unit 10 is used for a double-gate TFT, it is advantageous to enhance the synchronism of upper and lower gate electrodes upon turning-on and turning-off of the TFT.

It is to be noted that, regarding other parts of the shift register unit provided in the embodiment shown in FIG. 10A and the technical effects, reference to the corresponding descriptions in the embodiment shown in FIG. 4A can be made, and they are not restated herein.

Figure 11:
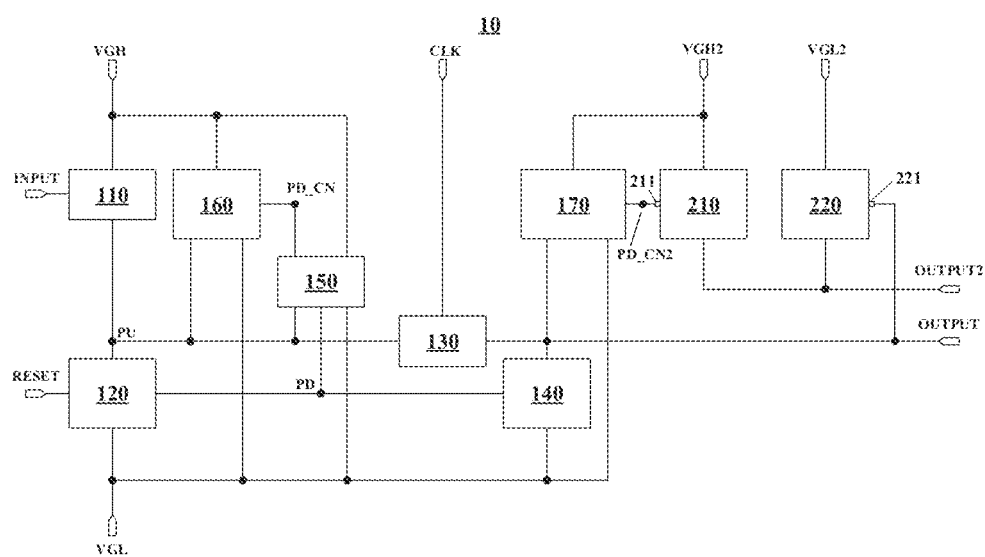
FIG. 11 is a schematic block diagram illustrating a shift register unit provided by another embodiment of the present disclosure.

According to another embodiment of this disclosure, there is provided a shift register unit 10. As shown in FIG. 11, the shift register unit 10 differs from the shift register unit shown in FIG. 9 in that, a second pull-down control circuit 170 is merely connected with a third voltage terminal VGH2 in this embodiment, but is not connected with a first voltage terminal VGH.

Figure 12A:
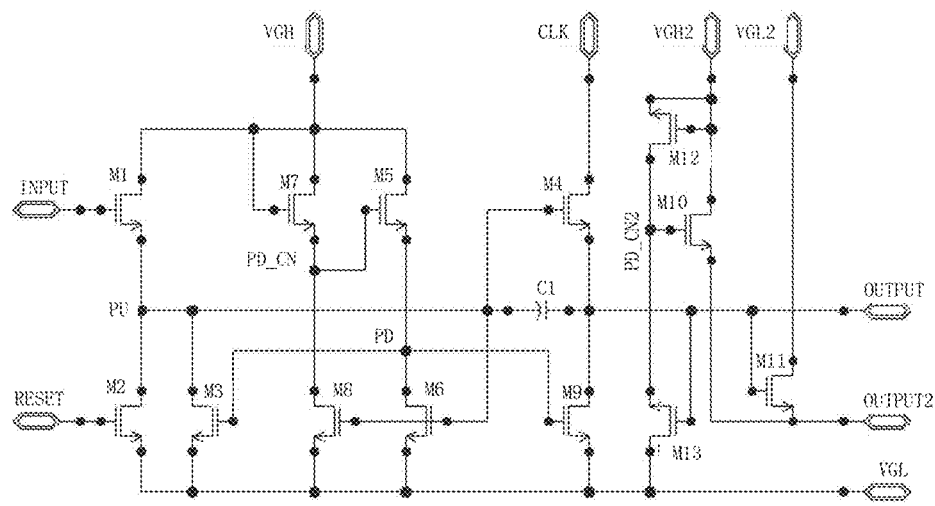
FIG. 12A is a schematic circuit diagram illustrating a concrete implementation example of the shift register unit shown in FIG. 11.

For example, similar to the embodiment 4 shown in FIG. 9, the shift register unit 10 shown in FIG. 11 may be implemented as a circuit structure shown in FIG. 12A. Likewise the shift register unit 10 includes first to thirteenth transistors M1-M13 and a storage capacitor C1. The circuit structure of the shift register unit 10 shown in FIG. 12A differs from that in FIG. 10A in that, a gate electrode of the twelfth transistor M12 is connected with its first electrode in this embodiment, and is configured to be connected with the third voltage terminal VGH2 so as to receive a third voltage.

Figure 12B:
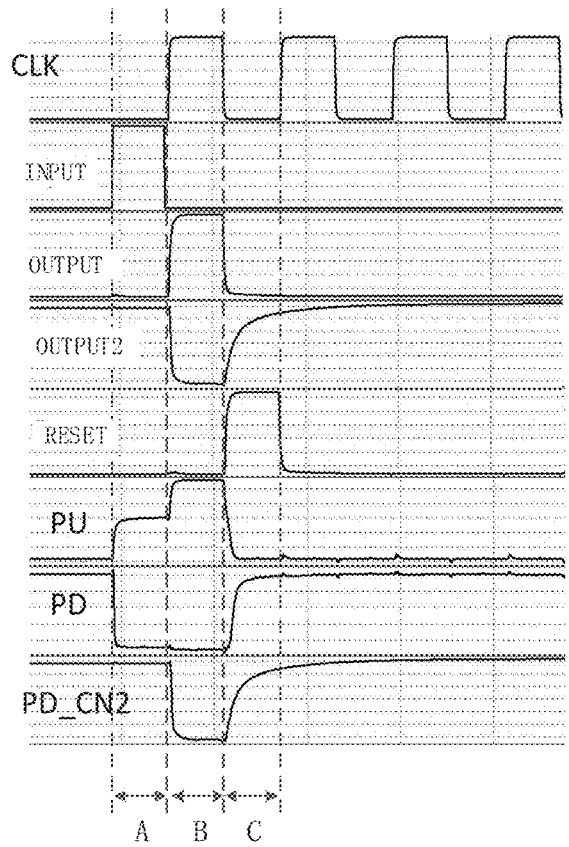
FIG. 12B is a signal timing diagram corresponding to FIG. 12A.

FIG. 12B is a signal timing diagram corresponding to FIG. 12A, and the difference between the shift register unit 10 shown in FIG. 12A and the shift register unit shown in FIG. 10A in operation will be illustrated below in conjunction with FIG. 12B.

For example, when a third voltage input by the third voltage terminal VGH2 is relatively low, a second pull-down control node PD_CN2 will be charged to a relatively low level, and its control ability will become weaker. Therefore, when the second pull-down control node PD_CN2 is pulled down at the second stage B, the time for the falling edge of its level will become shorter (namely, it will be pulled down faster), and the time for the rising edge will become longer. In turn, this causes the time for the falling edge of the level of the second output terminal OUTPUT2 to become shorter, and the time for its rising edge to become longer.

In the above, a way of adjusting the output waveform is provided. For example, when the characteristics of each TFT in a shift register unit 10 change, the actual output waveform may be inconsistent with the stimulation output waveform. In connection with the embodiment shown in FIG. 10A, the desired output waveform can be obtained by adjusting the connecting way of the twelfth transistor M12 and the levels of voltage signals input by the first voltage terminal VGH and the third voltage side VGH2.

It is to be noted that, regarding other parts of the shift register unit provided in the embodiment shown in FIG. 12A and the technical effects, reference to the corresponding descriptions in the embodiment shown in FIG. 4A can be made, and they are not restated herein.

Figure 13A:
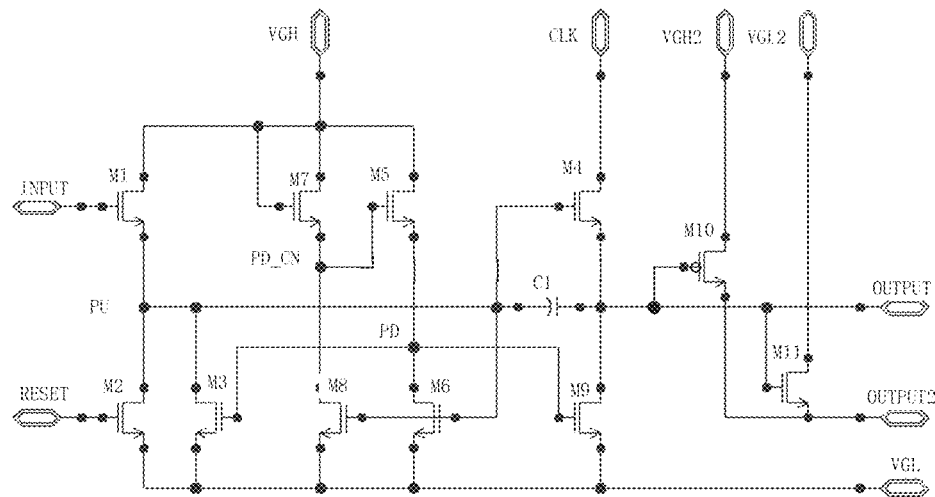
FIG. 13A is a schematic circuit diagram illustrating a shift register unit provided by another embodiment of the present disclosure.

According to another embodiment of this disclosure, there is provided a shift register unit 10. As shown in FIG. 13A, the shift register unit 10 differs from the shift register unit shown in FIG. 4A in the connecting way of a tenth transistor M10 and the transistor type adopted by the tenth transistor. Here, the tenth transistor M10 adopts a P-type transistor, and its gate electrode is connected with a first output terminal OUTPUT.

Figure 13B:
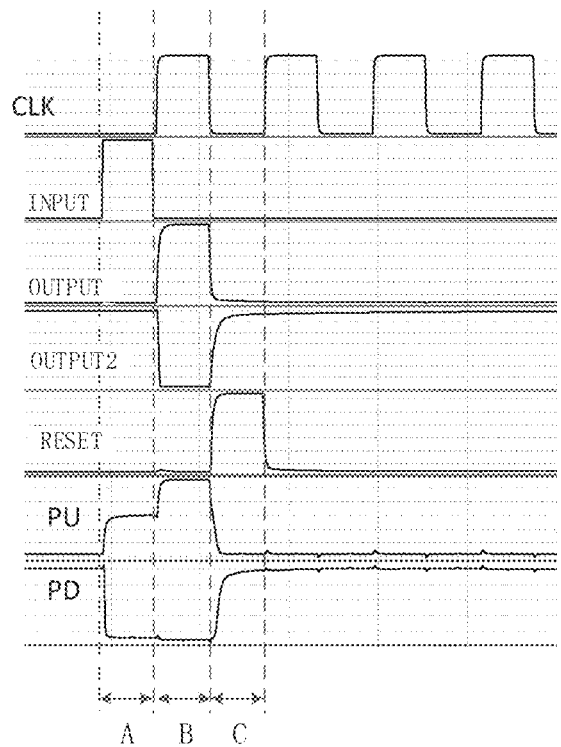
FIG. 13B is a signal timing diagram corresponding to FIG. 13A.

FIG. 13B is a signal timing diagram corresponding to FIG. 13A. By the above connecting way, for example, in a first stage A, the first output terminal OUTPUT outputs a low level, and an eleventh transistor M11 is cut off. Because the tenth transistor M10 is a P-type transistor, the tenth transistor M10 is turned on, and then a high level input from a third voltage terminal VGH2 is output by a second output terminal OUTPUT2. For example, in a second stage B, the first output terminal OUTPUT outputs a high level. Because the tenth transistor M10 is a P-type transistor, the tenth transistor M10 is turned off. While at this time the eleventh transistor M11 is turned on, and thus, a low level input form a fourth voltage terminal VGL2 is output by the second output terminal OUTPUT2.

It is to be noted that, in the embodiment shown in FIG. 13A, it is not limited to such a case where the tenth transistor M10 is a P-type transistor while the eleventh transistor M11 is an N-type transistor. It is also possible to set the tenth transistor M10 as an N-type transistor and to set the eleventh transistor M11 as a P-type transistor. In this case, the only configuration is to connect the tenth transistor M10 to a fourth voltage terminal VGL2, and to connect the eleventh transistor M11 to a third voltage terminal VGH2.

Additionally, regarding other parts of the shift register unit provided in the embodiment shown in FIG. 13A and the technical effects, reference to the corresponding descriptions in the embodiment shown in FIG. 4A can be made, and they are not restated herein.

Figure 14:
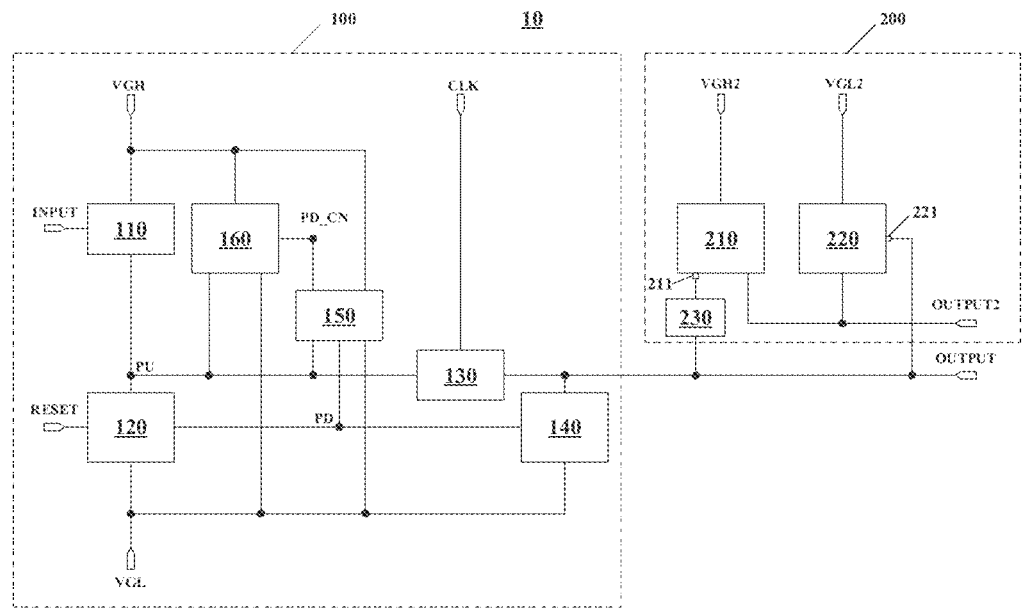
FIG. 14 is a schematic block diagram illustrating a shift register unit provided by another embodiment of the present disclosure.

According to another embodiment of this disclosure, there is provided a shift register unit 10. As shown in FIG. 14, the shift register unit 10 differs from the shift register unit as shown in FIG. 3 in that, a second circuit unit 200 may further include an inverter 230 in this embodiment. The inverter 230 is connected between a control terminal 211 of a first switching circuit 210 and a first output terminal OUTPUT, and is configured to make a first output signal be inverted in phase and transmit the inverted signal to the control terminal 211 of the first switching circuit 210.

Figure 15:
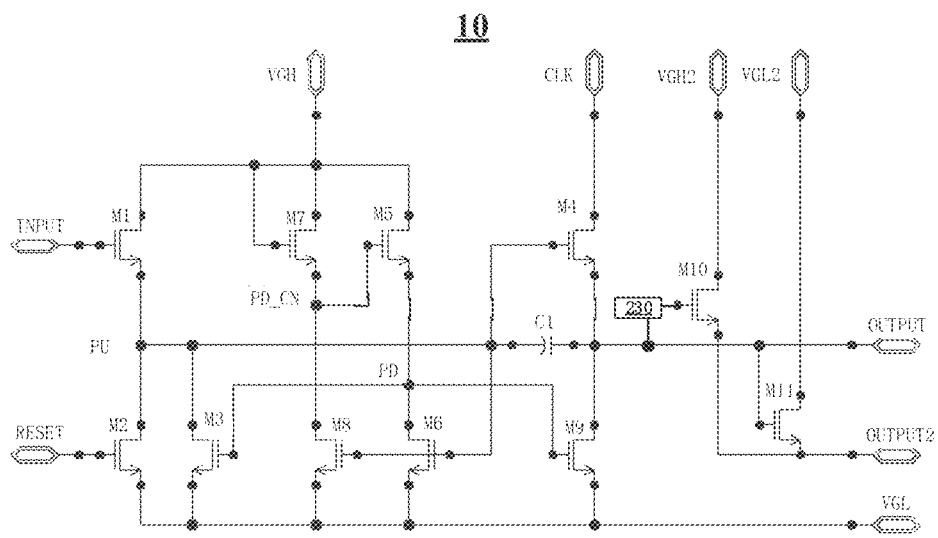
FIG. 15 is a schematic circuit diagram illustrating a concrete implementation example of the shift register unit shown in FIG. 14.

For example, the shift register unit 10 shown in FIG. 14 may be implemented as a circuit structure shown in FIG. 15. The shift register unit 10 includes first to eleventh transistors M1-M11 as well as a storage capacitor C1 and an inverter 230. A gate electrode of the tenth transistor M10 functioning as control terminal of the first switching circuit 210 is connected with one terminal of the inverter 230, and the other terminal of the inverter 230 is connected with the first output terminal OUTPUT.

For example, when the first switching circuit 210 and a second switching circuit 220 adopt N-type transistors, it is easy to understand that, when the first output terminal OUTPUT outputs a low level, the eleventh transistor M11 is cut off. Since the low level output from the first output terminal OUTPUT is input to a gate electrode of the tenth transistor M10 after passing through the inverter 230, the tenth transistor M10 is switched on. Thereby, the second output terminal OUTPUT2 outputs a high level input from a third voltage terminal VGH2. For example, when the first output terminal OUTPUT outputs a high level, the tenth transistor M10 is cut off because the high level output from the first output terminal OUTPUT is input to a gate electrode of the tenth transistor M10 after passing through the inverter 230. The eleventh transistor M11 is switched on as a result of the high level output from the first output terminal OUTPUT, and therefore the second output terminal OUTPUT2 outputs a low level input from a fourth voltage terminal VGL2.

In the embodiment shown in FIG. 15, in case where the first switching circuit 210 and the second switching circuit 220 employ N-type transistors, for example, the inverter 230 may also be connected between a gate electrode of the eleventh transistor M11 and the first output terminal OUTPUT. Accordingly, it is only necessary to connect the tenth transistor M10 with the fourth voltage terminal VGL2, and to connect the eleventh transistor M11 with the third voltage terminal VGH2. For another example, the tenth transistor M10 and the eleventh transistor M11 may also adopt P-type transistors, and in this case, the only configuration is to connect the inverter 230 between a gate electrode of the eleventh transistor M11 and the first output terminal OUTPUT. For another example, in a case where the tenth transistor M10 and the eleventh transistor M11 adopt P-type transistors, an inverter 230 may be connected between a gate electrode of the tenth transistor M10 and the first output terminal OUTPUT, and in this case, it is only necessary to connect the tenth transistor M10 with a fourth voltage terminal VGL2, and to connect the eleventh transistor M11 with a third voltage terminal VGH2. All of these above-mentioned examples fall within the protection scope of the present disclosure as well.

Additionally, regarding other parts of the shift register unit provided in the embodiment shown in FIG. 15 and the technical effects, reference to the corresponding descriptions in the embodiment shown in FIG. 4A can be made, and they are not restated herein.

Figure 16:
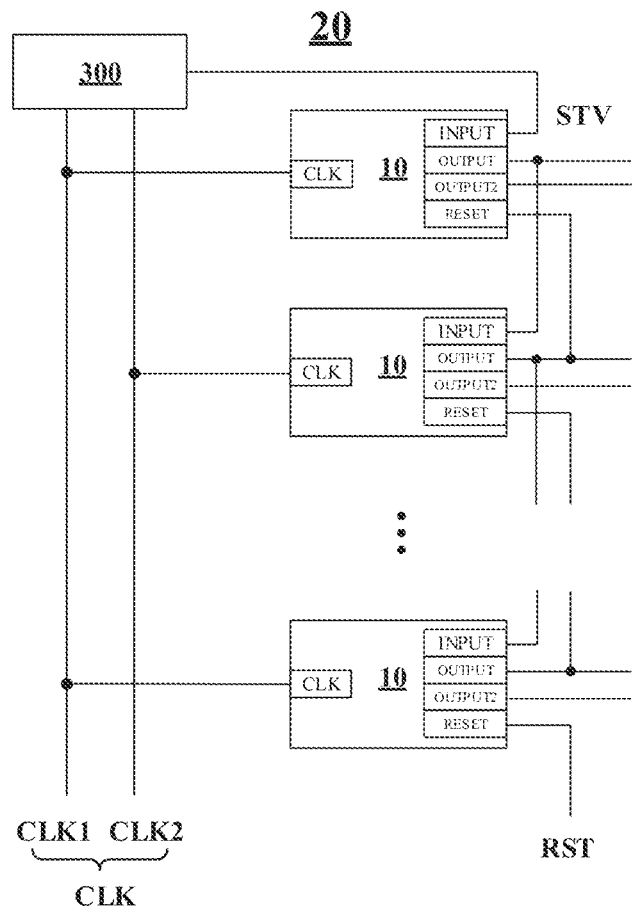
FIG. 16 is a schematic diagram illustrating a driving device provided by an embodiment of the present disclosure.

According to an embodiment of the present disclosure, there is further provided a driving device 20, which includes a plurality of cascaded shift register units 10, as shown in FIG. 16. The shift register units 10 may employ any of shift register units provided in embodiments of the present disclosure. The driving device 20 may be directly integrated onto an array substrate of a display device by using the same process as the thin-film-transistor process, so as to realize a line-by-line scanning drive function.

For example, as shown in FIG. 16, except for a shift register unit at the first level, an input terminal INPUT of a shift register unit at every one of the remaining levels is connected with a first output terminal OUTPUT of a shift register unit at the previous level. Except for a shift register unit at the last level, a reset terminal RESET of a shift register unit at every one of the remaining levels is connected with a first output terminal OUTPUT of a shift register unit at the next level. For example, an input terminal INPUT of the first-level shift register unit may be configured to receive a trigger signal STV, and a reset terminal RESET of the last-level shift register unit may be configured to receive a reset signal RST.

For example, as shown in FIG. 16, a shift register unit at each level is configured to output a corresponding scan driving signal in response to a clock signal CLK. The clock signal CLK may include, for example, different clock signals CLK1 and CLK2.

For example, as shown in FIG. 16, the driving device 20 may further include a timing controller 300. The timing controller 300 is configured to provide a clock signal CLK to a shift register unit at each level, and the timing controller 300 may also be configured to provide a trigger signal STV and a reset signal RST.

It is to be noted that, the embodiments of this disclosure include but are not limited to the situation shown in FIG. 16, and the timing controller 300 may also be configured to provide four different clock signals to a shift register unit at each level via four clock signal lines. Embodiments of this disclosure do not place limitations on this.

In the driving device 20 provided by an embodiment of the present disclosure, a first output terminal OUTPUT and a second output terminal OUTPUT2 of a shift register unit at each of levels may output two output signals that are mutually phase-inverted, and for example, may be connected to gate lines in a display panel for driving a TFT having a double-gate structure in a display area of the display panel for example. As to the technical effects of the driving device, reference to the corresponding descriptions in an embodiment concerning a shift register unit 10 can be made, and details are omitted here.

Figure 17:
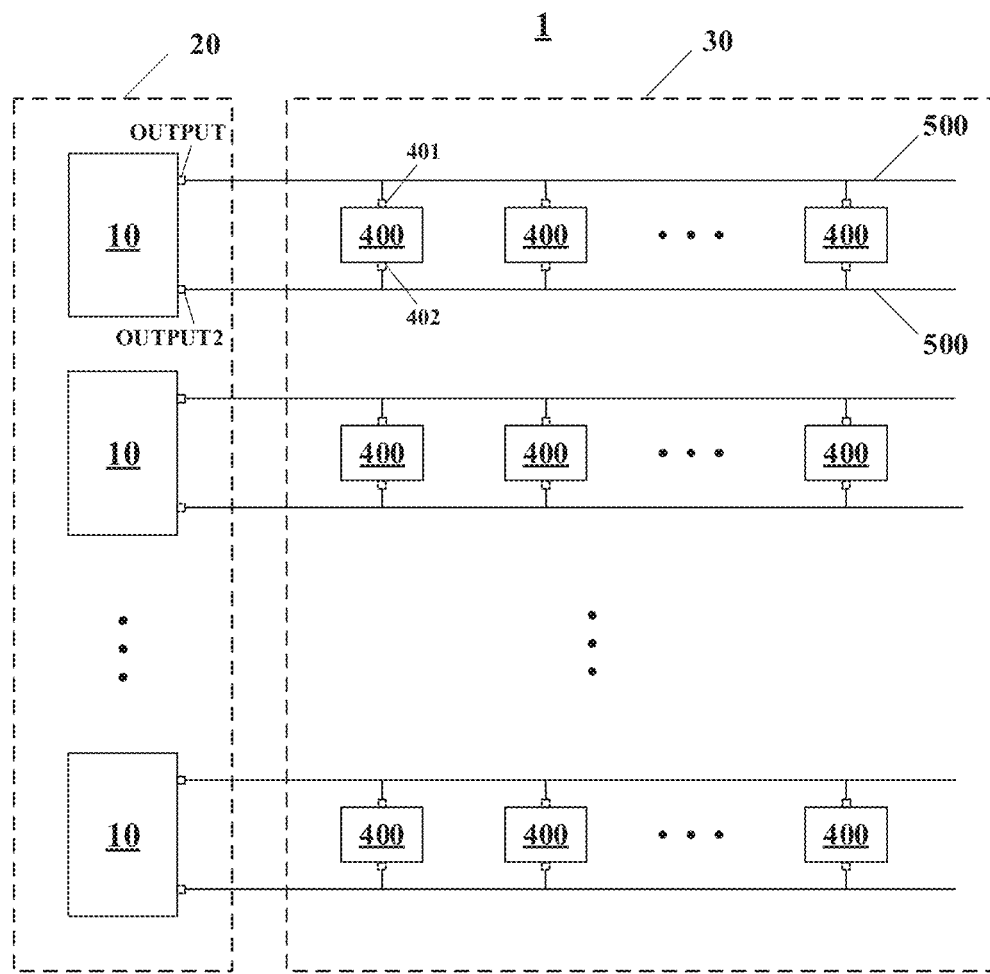
FIG. 17 is a schematic diagram illustrating a display device provided by an embodiment of the disclosure.

According to an embodiment of the present disclosure, there is further provided a display device 1, which includes the driving device 20 provided by an embodiment of the present disclosure, as shown in FIG. 17.

For example, the display device 1 further includes a display panel, in the display area 30 of which, there are provided a plurality of pixel units distributed in an array. Each of the pixel units includes, for example, a transistor 400 for display functioning as an input/write switching circuit, and the transistor 400 for display may adopt a double-gate type transistor for example.

For example, as shown in FIG. 17, a first output terminal OUTPUT of a shift register unit 10 of each row is electrically connected with a first gate electrode 401 of a transistor 400 for display in the current row. For example, it may be electrically connected with the first gate electrode 401 of the transistor 400 for display in the current row by a gate line 500.

For example, a second output terminal OUTPUT2 of a shift register unit 10 of each row is electrically connected with a second gate electrode 402 of a transistor 400 for display in the current row. For example, it may be electrically connected to the second gate electrode 402 of the transistor 400 for display in the current row by another gate line 500.

Figure 18:
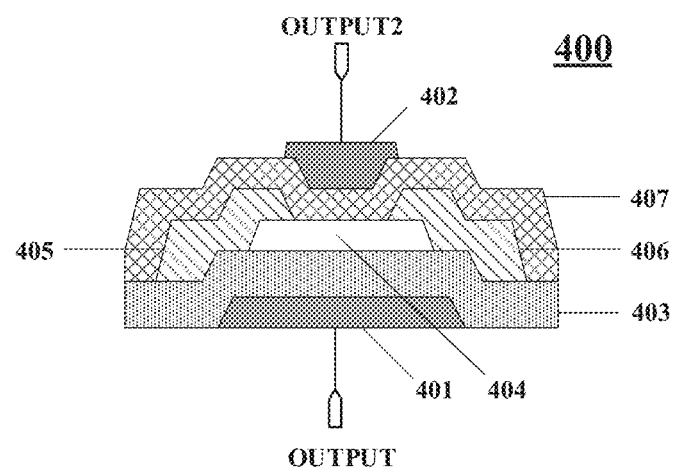
FIG. 18 is a schematically sectional view illustrating a double-gate transistor.

For example, a schematic sectional view of each transistor 400 for display is shown in FIG. 18, and it includes two gate electrodes, which are a first gate electrode 401 (bottom gate electrode) and a second gate electrode 402 (top gate electrode), respectively. In addition, the transistor 400 for display may further include a gate insulating layer 403, an active layer 404, a source electrode 405, a drain electrode 406 and a passivation layer 407.

It is to be noted that, in the transistor 400 for display shown in FIG. 18, the first gate electrode 401 (bottom gate electrode) is electrically connected to a first output terminal OUTPUT, while the second gate electrode 402 (top gate electrode) is electrically connected to a second output terminal OUTPUT2. This is connected with the case where the transistor 400 for display adopts an N-type transistor. In this case, when the output from the first output terminal OUTPUT is a high level and the output from the second output terminal OUTPUT2 is a low level, the transistor 400 for display is turned on; when the output from the first output terminal OUTPUT is a low level and the output from the second output terminal OUTPUT2 is a high level, the transistor 400 for display is turned off.

Embodiments of the present disclosure include, but are not limited to, the above manner, and for example, the transistor 400 for display may also adopt a P-type transistor. In this case, it is necessary to electrically connect a first gate electrode 401 (bottom gate electrode) with a second output terminal OUTPUT2, and to electrically connect a second gate electrode 402 (top gate electrode) with a first output terminal OUTPUT. Thus, when a high level is output from the first output terminal OUTPUT and a low level is output from the second output terminal OUTPUT2, the transistor 400 for display is turned on; when a low level is output from the first output terminal OUTPUT and a high level is output from the second output terminal OUTPUT2, the transistor 400 for display is turned off.

In the display device 1 provided by embodiments of the present disclosure, by applying two output signals that are mutually phase-inverted to two gate electrodes of a double-gate transistor in a display area 30, respectively, the driving voltage can be reduced. Thus, the logic power consumption is reduced on condition that the same charging rate is satisfied, and the driving capability is enhanced. Moreover, when defects (such as residual images, crosstalk, etc. resulting from ON/OFF current drift and threshold voltage shift) occur in the transistor 400 for display in the display area 30, level of a driving voltage applied to the second gate electrode (e.g., top gate electrode) may also be adjusted. Thus, the ON/OFF current drift and threshold voltage shift of the transistor 400 for display can be compensated, without affecting TFTs in the driving device 20.

It is to be noted that, the transistor 400 for display described in an embodiment of the present disclosure represents a transistor that is used in the display area 30 for the purpose of realizing the display function, in contrast with a transistor used in the driving device 20.

For example, the display device 1 provided in the embodiment of the present disclosure may be any product or component having display function, such as an electronic paper, a mobile phone, a tablet computer, a television set, a display, a notebook computer, a digital photo frame, a navigator, etc.

According to an embodiment of the present disclosure, there is further provided a driving method, which is usable for driving a shift register unit 10. For example, the driving method includes the following operations.

In a first stage, a pull-up node PU is charged by a first voltage input from a first voltage terminal VGH, a first output terminal OUTPUT outputs a low level input from a clock signal terminal CLK, and a second output terminal OUTPUT2 outputs a high level input from a third voltage terminal VGH2.

In a second stage, the potential of the pull-up node PU is raised by the high level input from the clock signal terminal CLK, the first output terminal OUTPUT outputs a high level input from the clock signal terminal CLK, and the second output terminal OUTPUT2 outputs a low level input from a fourth voltage terminal VGL2.

In a third stage, a reset terminal RESET resets the pull-up node PU in response to a reset signal, the first output terminal OUTPUT outputs a low level input from the second voltage terminal OUTPUT2, and the second output terminal OUTPUT2 outputs a high level input from the third voltage terminal VGL2.

By adopting the above described method, it is possible to make a second output signal output from the second output terminal OUTPUT2 and a first output signal output from the first output terminal OUTPUT be mutually phase-inverted signals. Regarding detailed description of the driving method for the shift register unit 10 provided by the embodiments of the present disclosure and the technical effects, reference to the corresponding descriptions in the above embodiments can be made, and they are not restated here.

According to another embodiment of the present disclosure, there is further provided a driving method, which is applicable for driving a display device 1 provided by the embodiments of the present disclosure. For example, the driving method includes the following operations.

With aid of a first output terminal OUTPUT of a shift register unit 10 of each row, a first gate driving signal is provided to a first gate electrode 401 of a transistor 400 for display in the current row; with aid of a second output terminal OUTPUT2 of a shift register unit 10 of each row, a second gate driving signal is provided to a first gate electrode 401 of a transistor 400 for display in the current row; with aid of a third voltage terminal VGH2 and a fourth voltage terminal VGL2 of a shift register unit 10 of each row, ON/OFF voltage of a transistor 400 for display in the current row are adjusted.

For example, by adjusting level of a third voltage input by the third voltage terminal VGH2 of the shift register unit 10 of each row, and by adjusting level of a fourth voltage input by the fourth voltage terminal VGL2, the driving voltage applied on a second gate electrode 402 of the transistor 400 for display in the current row can be adjusted, that is, the ON/OFF voltage of the transistor 400 for display can be adjusted. Thus, when defects (such as residual images, crosstalk, etc. resulting from ON/OFF current drift and threshold voltage shift) occur in the transistor 400 for display, the ON/OFF current drift and threshold voltage shift of the transistor 400 for display can be compensated, without affecting transistors in the driving device 20.

Regarding detailed descriptions of the driving method for the display device 1 provided by the embodiments of the present disclosure and the technical effects, reference to the corresponding descriptions in an embodiment concerning the display device 1 can be made, and they are not restated here.

It is to be noted that, the first voltage and the third voltage described in embodiments of the present disclosure are high-level voltages, such as with an amplitude in the range of 10V to 40V. The second voltage and the fourth voltage described in embodiments of the present disclosure are low-level voltages, such as with an amplitude in the range of −50V to 4V.

It is to be noted that, the shift register unit, the driving device, the display device and the driving method provided by the embodiments of the present disclosure are all illustrated with reference to an example in which a double-gate type transistor is driven, but the present disclosure does not place limitations on this. Any circuit or device that needs to be driven by two phase-inverted signals can be used as an object suitable for the embodiments of the present disclosure.

What are described above is related to the illustrative embodiments of the disclosure only and not limitative to the scope of the disclosure; the scopes of the disclosure are defined by the accompanying claims.

What is claimed is:

1. A shift register unit, comprising:
a first circuit unit and a second circuit unit,
wherein the first circuit unit comprises an input terminal, a reset terminal, a clock signal terminal, a first voltage terminal, a second voltage terminal and a first output terminal, and is configured to output a first output signal of the shift register unit from the first output terminal;
the second circuit unit comprises a third voltage terminal, a fourth voltage terminal and a second output terminal, and is configured to output a second output signal of the shift register unit from the second output terminal, at least under the control of the first output signal; and
the second output signal and the first output signal are mutually phase-inverted signals;
the second circuit unit comprises a first switching circuit and a second switching circuit,
the first switching circuit is connected between the third voltage terminal and the second output terminal,
the second switching circuit is connected between the fourth voltage terminal and the second gvoutput terminal, and a control terminal of the second switching circuit is configured to be connected with the first output terminal so as to receive the first output signal;
the first switching circuit comprises:
a tenth transistor, a gate electrode of which is configured to be connected with the first output terminal, a first electrode of which is configured to be connected with the third voltage terminal, and a second electrode of which is configured to be connected with the second output terminal so as to output the third voltage;

the second switching circuit comprises:

an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage, wherein one of the tenth transistor and the eleventh transistor is an N-type transistor, and the other of the tenth transistor and the eleventh transistor is a P-type transistor.

2. The shift register unit claimed as claim 1, wherein the first circuit unit comprises:

an input circuit, connected among the input terminal, the first voltage terminal and a pull-up node, and configured to charge the pull-up node in response to an input signal received by the input terminal;

a pull-up node reset circuit, connected among the reset terminal, the pull-up node, the second voltage terminal and a pull-down node, and configured to reset the pull-up node, under control of a reset signal received by the reset terminal or level of the pull-down node;

an output circuit, connected among the pull-up node, the clock signal terminal and the first output terminal, and configured to output a clock signal received by the clock signal terminal to the first output terminal, under control of level of the pull-up node;

an output reset circuit, connected between the second voltage terminal and the first output terminal, and configured to reset the first output terminal, under control of the second output signal or level of the pull-down node;

a pull-down circuit, connected among the first voltage terminal, the second voltage terminal, the pull-up node, the pull-down node and a first pull-down control node, and configured to control level of the pull-down node, under control of levels of the pull-up node and the first pull-down control node; and a first pull-down control circuit, connected between the first voltage terminal, the second voltage terminal, the pull-up node and the first pull-down control node, and configured to control level of the first pull-down control node, under control of level of the pull-up node.

3. The shift register unit claimed as claim 2, wherein a control terminal of the first switching circuit is connected with the first pull-down control node, so that the first switching circuit is controlled by a level of the first pull-down control node.

4. The shift register unit claimed as claim 2, wherein the input circuit comprises:

a first transistor, a gate electrode of which is configured to be connected with the input terminal so as to receive the input signal, a first electrode of which is configured to be connected with the first voltage terminal so as to receive a first voltage, and a second electrode of which is configured to be connected with the pull-up node so as to charge the pull-up node;

the pull-up node reset circuit comprises:

a second transistor, a gate electrode of which is configured to be connected with a reset terminal so as to receive the reset signal, a first electrode of which is configured to be connected with the pull-up node so as to reset the pull-up node, and a second electrode of which is configured to be connected with the second voltage terminal so as to receive a second voltage, and a third transistor, a gate electrode of which is configured to be connected with the pull-down node, a first electrode of which is configured to be connected with the pull-up node so as to reset the pull-up node, and a second electrode of which is configured to be connected with the second voltage terminal so as to receive a second voltage; and the output circuit comprises:

a fourth transistor, a gate electrode of which is configured to be connected with the pull-up node, a first electrode of which is configured to be connected with the clock signal terminal so as to receive the clock signal, and a second electrode of which is configured to be connected with the first output terminal so as to output the first output signal, and a storage capacitor, a first electrode of which is connected with the gate electrode of the fourth transistor, and a second electrode of which is connected the second electrode of the fourth transistor.

5. The shift register unit claimed as claim 2, wherein the pull-down circuit comprises:

a fifth transistor, a gate electrode of which is configured to be connected with the first pull-down control node, a first electrode of which is configured to be connected with the first voltage terminal so as to receive a first voltage, and a second electrode of which is configured to be connected with the pull-down node; and a sixth transistor, a gate electrode of which is configured to be connected with the pull-up node, a first electrode of which is configured to be connected with the pull-down node, and a second electrode of which is configured to be connected with the second voltage terminal so as to receive a second voltage;

the first pull-down control circuit comprises:

a seventh transistor, a gate electrode of which is connected with a first electrode of the seventh transistor, and is configured to be connected with the first voltage terminal so as to receive the first voltage, and a second electrode of which is configured to be connected with the first pull-down control node; and an eighth transistor, a gate electrode of which is configured to be connected with the pull-up node, a first electrode of which is configured to be connected with the first pull-down control node, and a second electrode of which is configured to be connected with the second voltage terminal so as to receive a second voltage.

6. The shift register unit claimed as claim 2, wherein the output reset circuit comprises:

a ninth transistor, a gate electrode of which is configured to be connected with the pull-down node, a first electrode of which is configured to be connected with the first output terminal so as to output a second voltage to the first output terminal, and a second electrode of which is configured to be connected with the second voltage terminal so as to receive the second voltage.

7. The shift register unit claimed as claim 2, wherein the output reset circuit comprises:

a ninth transistor, a gate electrode of which is configured to be connected with the second output terminal, a first electrode of which is configured to be connected with the first output terminal so as to output a second voltage to the first output terminal, and a second electrode of which is configured to be connected with the second voltage terminal so as to receive the second voltage.

8. The shift register unit claimed as claim 2, wherein the first switching circuit comprises:
a tenth transistor, a gate electrode of which functioning as a control terminal of the first switching circuit is connected with the first pull-down control node, a first electrode of which is configured to be connected with the third voltage terminal so as to receive a third voltage, and a second electrode of which is configured to be connected with the second output terminal so as to output the third voltage;
the second switching circuit comprises:
an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage.

9. The shift register unit claimed as claim 2, wherein the first circuit unit further comprises a second pull-down control circuit, and the second pull-down control circuit is configured to control a level of a second pull-down control node, under control of the first output signal,
a control terminal of the first switching circuit is connected with the second pull-down control node, so that the first switching circuit is controlled by the level of the second pull-down control node.

10. The shift register unit claimed as claim 9, wherein the second pull-down control circuit comprises:
a twelfth transistor, a gate electrode of which is configured to be connected with the first voltage terminal so as to receive a first voltage, a first electrode of which is configured to be connected with the third voltage terminal so as to receive a third voltage, and a second electrode of which is configured to be connected with the second pull-down control node; and
a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

11. The shift register unit claimed as claim 9, wherein the second pull-down control circuit comprises:
a twelfth transistor, a gate electrode of which is connected with a first electrode of the twelfth transistor, and is configured to be connected with the first voltage terminal so as to receive a first voltage, and a second electrode of which is configured to be connected with the second pull-down control node; and
a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

12. The shift register unit claimed as claim 9, wherein the second pull-down control circuit comprises:
a twelfth transistor, a gate electrode of which is connected with a first electrode of the twelfth transistor, and is configured to be connected with the third voltage terminal so as to receive a third voltage, and a second electrode of which is configured to be connected with the second pull-down control node; and
a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

13. The shift register unit claimed as claim 1, wherein the second circuit unit further comprises an inverter, and the inverter is connected between a control terminal of the first switching circuit and the first output terminal, and configured to make the first output signal be inverted in phase and then transmit the first output signal after inverting to the control terminal of the first switching circuit.

14. A driving device, comprising a plurality of cascaded shift register units each claimed as claim 1,
wherein except for a shift register unit at a first level, an input terminal of a shift register unit at every one of remaining levels is connected with a first output terminal of a shift register unit at a previous level; and
except for a shift register unit at a last level, a reset terminal of a shift register unit at every one of remaining levels is connected with a first output terminal of a shift register unit at a next level.

15. A display device, comprising the driving device claimed as claim 14.

16. The display device claimed as claim 15, further comprising a display panel, wherein the display panel comprises a plurality of transistors for display that are distributed in an array, the transistors for display comprise double-gate type transistors,
a first output terminal of a shift register unit of each row is electrically connected with a first gate electrode of a transistor for display in a current row, and
a second output terminal of a shift register unit of each row is electrically connected with a second gate electrode of a transistor for display in the current row.

17. A driving method of the display device claimed as claim 16, comprising:
providing a first gate driving signal by the first output terminal of the shift register unit of each row to the first gate electrode of the transistor for display in the current row;
providing a second gate driving signal by the second output terminal of the shift register unit of each row to the second gate electrode of the transistor for display in the current row; and
adjusting ON/OFF voltage of the transistor for display in the current row, with aid of a third voltage terminal and a fourth voltage terminal of the shift register unit of each row.

18. A driving method of a shift register unit,
wherein the shift register unit comprises a first circuit unit and a second circuit unit,
the first circuit unit comprises an input terminal, a reset terminal, a clock signal terminal, a first voltage terminal, a second voltage terminal and a first output terminal, and is configured to output a first output signal of the shift register unit from the first output terminal;
the second circuit unit comprises a third voltage terminal, a fourth voltage terminal and a second output terminal, and is configured to output a second output signal of the shift register unit from the second output terminal, at least under the control of the first output signal, the second circuit unit comprises a first switching circuit and a second switching circuit, the first switching circuit is connected between the third voltage terminal and the second output terminal, the second switching circuit is connected between the fourth voltage terminal and the second output terminal, and a control terminal of the second switching circuit is configured to be connected with the first output terminal so as to receive the first output signal;

the first switching circuit comprises:

a tenth transistor, a gate electrode of which is configured to be connected with the first output terminal, a first electrode of which is configured to be connected with the third voltage terminal, and a second electrode of which is configured to be connected with the second output terminal so as to output the third voltage;

the second switching circuit comprises:

an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage, wherein one of the tenth transistor and the eleventh transistor is an N-type transistor, and the other of the tenth transistor and the eleventh transistor is a P-type transistor;

the method comprising:

in a first stage, charging a pull-up node with a first voltage input from the first voltage terminal, outputting a low level input from the clock signal terminal by the first output terminal, and outputting a high level input from the third voltage terminal by the second output terminal;

in a second stage, raising a potential of the pull-up node by a high level input from the clock signal terminal, outputting the high level input from the clock signal terminal by the first output terminal, and outputting a low level input from the fourth voltage terminal by the second output terminal;

in a third stage, resetting the pull-up node by the reset terminal in response to a reset signal, outputting a low level input from the second voltage terminal by the first output terminal, and outputting a high level input from the third voltage terminal by the second output terminal;

wherein the second output signal output by the second output terminal and the first output signal output by the first output terminal are mutually phase-inverted signals.

19. A shift register unit, comprising a first circuit unit and a second circuit unit, wherein the first circuit unit comprises an input terminal, a reset terminal, a clock signal terminal, a first voltage terminal, a second voltage terminal and a first output terminal, and is configured to output a first output signal of the shift register unit from the first output terminal;

the second circuit unit comprises a third voltage terminal, a fourth voltage terminal and a second output terminal, and is configured to output a second output signal of the shift register unit from the second output terminal, at least under the control of the first output signal; and the second output signal and the first output signal are mutually phase-inverted signals;

the second circuit unit comprises a first switching circuit and a second switching circuit, the first switching circuit is connected between the third voltage terminal and the second output terminal, the second switching circuit is connected between the fourth voltage terminal and the second output terminal, and a control terminal of the second switching circuit is configured to be connected with the first output terminal so as to receive the first output signal;

the first circuit unit comprises:

an input circuit, connected among the input terminal, the first voltage terminal and a pull-up node, and configured to charge the pull-up node in response to an input signal received by the input terminal;

a pull-up node reset circuit, connected among the reset terminal, the pull-up node, the second voltage terminal and a pull-down node, and configured to reset the pull-up node, under control of a reset signal received by the reset terminal or level of the pull-down node;

an output circuit, connected among the pull-up node, the clock signal terminal and the first output terminal, and configured to output a clock signal received by the clock signal terminal to the first output terminal, under control of level of the pull-up node;

an output reset circuit, connected between the second voltage terminal and the first output terminal, and configured to reset the first output terminal, under control of the second output signal or level of the pull-down node;

a pull-down circuit, connected among the first voltage terminal, the second voltage terminal, the pull-up node, the pull-down node and a first pull-down control node, and configured to control level of the pull-down node, under control of levels of the pull-up node and the first pull-down control node; and a first pull-down control circuit, connected between the first voltage terminal, the second voltage terminal, the pull-up node and the first pull-down control node, and configured to control level of the first pull-down control node, under control of level of the pull-up node;

wherein the output reset circuit comprises:

a ninth transistor, a gate electrode of which is configured to be connected with the second output terminal, a first electrode of which is configured to be connected with the first output terminal so as to output a second voltage to the first output terminal, and a second electrode of which is configured to be connected with the second voltage terminal so as to receive the second voltage.

20. The shift register unit claimed as claim 19, wherein the first switching circuit comprises:

a tenth transistor, a gate electrode of which functioning as a control terminal of the first switching circuit is connected with the first pull-down control node, a first electrode of which is configured to be connected with the third voltage terminal so as to receive a third voltage, and a second electrode of which is configured to be connected with the second output terminal so as to output the third voltage;

the second switching circuit comprises:

an eleventh transistor, a gate electrode of which is configured to be connected with the first output terminal, a first electrode of which is configured to be connected with the fourth voltage terminal so as to receive a fourth voltage, and a second electrode of which is configured to be connected with the second output terminal so as to output the fourth voltage.

21. The shift register unit claimed as claim 19, wherein the first circuit unit further comprises a second pull-down control circuit, and the second pull-down control circuit is configured to control a level of a second pull-down control node, under control of the first output signal,
- a control terminal of the first switching circuit is connected with the second pull-down control node, so that the first switching circuit is controlled by the level of the second pull-down control node.

22. The shift register unit claimed as claim 21, wherein the second pull-down control circuit comprises:
- a twelfth transistor, a gate electrode of which is configured to be connected with the first voltage terminal so as to receive a first voltage, a first electrode of which is configured to be connected with the third voltage terminal so as to receive a third voltage, and a second electrode of which is configured to be connected with the second pull-down control node; and
- a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

23. The shift register unit claimed as claim 21, wherein the second pull-down control circuit comprises:
- a twelfth transistor, a gate electrode of which is connected with a first electrode of the twelfth transistor, and is configured to be connected with the first voltage terminal so as to receive a first voltage, and a second electrode of which is configured to be connected with the second pull-down control node; and
- a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

24. The shift register unit claimed as claim 21, wherein the second pull-down control circuit comprises:
- a twelfth transistor, a gate electrode of which is connected with a first electrode of the twelfth transistor, and is configured to be connected with the third voltage terminal so as to receive a third voltage, and a second electrode of which is configured to be connected with the second pull-down control node; and
- a thirteenth transistor, a gate electrode of which is configured to be connected with the first output terminal, a first electrode of which is configured to be connected with the second pull-down control node, and a second electrode of which is configured to be connected with the second voltage terminal so as to receive a second voltage.

* * * * *